(12) United States Patent
Kamimaru

(10) Patent No.: US 11,552,469 B2
(45) Date of Patent: Jan. 10, 2023

(54) SEMICONDUCTOR DEVICE

(71) Applicant: RENESAS ELECTRONICS CORPORATION, Tokyo (JP)

(72) Inventor: Dai Kamimaru, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 109 days.

(21) Appl. No.: 17/002,382

(22) Filed: Aug. 25, 2020

(65) Prior Publication Data

US 2021/0066911 A1    Mar. 4, 2021

(30) Foreign Application Priority Data

Sep. 2, 2019 (JP) .................. JP2019-159569

(51) Int. Cl.
*H02H 9/04* (2006.01)
*H01L 27/02* (2006.01)

(52) U.S. Cl.
CPC ......... *H02H 9/046* (2013.01); *H01L 27/0266* (2013.01)

(58) Field of Classification Search
CPC ............... H02H 9/046; H01L 27/0266; H03K 19/017509; H03K 19/018507
USPC ...................................... 361/91.5
See application file for complete search history.

(56) References Cited

U.S. PATENT DOCUMENTS

| | | | | |
|---|---|---|---|---|
| 6,141,200 A * | 10/2000 | Hinedi | ............ | H03K 19/00315 361/111 |
| 6,150,843 A * | 11/2000 | Shiffer | ............ | H03K 19/00315 326/80 |
| 6,212,050 B1 * | 4/2001 | Haider | ................ | H01L 27/0251 361/111 |
| 6,294,943 B1 * | 9/2001 | Wall | ................ | H03K 19/00315 327/543 |
| 6,690,555 B1 * | 2/2004 | Pasqualini | ....... | H03K 17/08142 361/91.1 |
| 2004/0218322 A1 * | 11/2004 | Chen | .................. | H01L 27/0285 361/56 |

* cited by examiner

*Primary Examiner* — Dharti H Patel
(74) *Attorney, Agent, or Firm* — McDermott Will & Emery LLP

(57) ABSTRACT

To provide a semiconductor device with a tolerant buffer capable of protecting the internal circuit even when the power supply potential is turned 0 [V]. In the semiconductor device, the protection voltage generating circuit 100 generates the larger of the divided voltage and the power supply voltage Vdd obtained by dividing the voltage padv applied to the pad 4 as the protection voltage protectv. The first protection circuit 200 for protecting the internal logic circuit 2A,2B and the output buffer 10 and the second protection circuit 300 for protecting the input buffer 20 operate protectv this protection voltage.

11 Claims, 18 Drawing Sheets

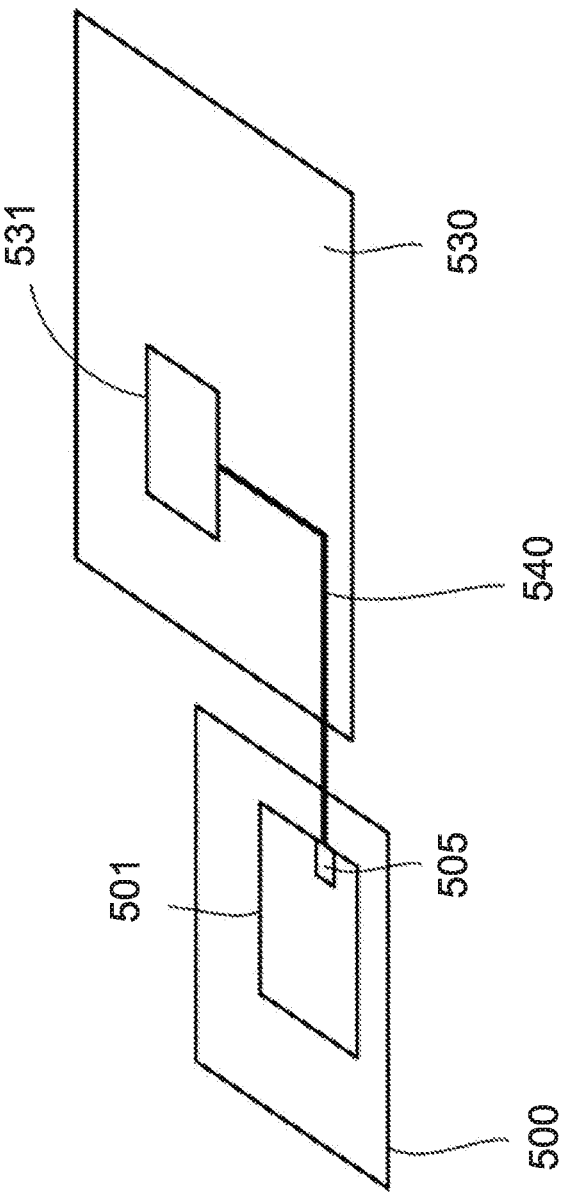

Case 2: Voltage Level Of Signal Wire Is Predetermined

FIG. 7

Output of Internal Logic is set 0 [V] since mid > Vdd, padv = 5.5 [V], Vdd = 0 [V], mid = protectv = 2.75 [V], Vtn = 0.5 [V], Vtp = 0.5 [V], Allowable Voltage Difference = 4.0 [V] and Vdd = 0 [V] (at non-conductive state)

| Circuit | Element | Between Drain - Source | Voltage Of Each Electrode | | | | Voltage Difference (Absolute Value) | | | | | | Unit |
|---|---|---|---|---|---|---|---|---|---|---|---|---|---|
| | | | Gate | Drain | Source | Backgate | Vgs | Vgd | Vds | Vgb | Vdb | Vsb | |
| 10 | P10_1 | OFF | padv | padv | mid | mid-Vtn | 2.75 | 0 | 2.75 | 3.25 | 3.25 | 0.5 | V |
| 10 | N10_1 | ON | mid | padv | mid-Vtn | 0 | 0.5 | 2.75 | 3.25 | 0.5 | 0 | 0.5 | V |
| 10 | N10_2 | OFF | 0 | mid-Vtn | 0 | 0 | 0 | 2.25 | 2.25 | 0 | 2.25 | 0 | V |
| 20 | P20_1 | OFF | mid-Vtn | 0 | Vdd | Vdd | 2.75 | 2.75 | 0 | 2.75 | 0 | 0 | V |
| 20 | N20_1 | ON | Vdd | 0 | 0 | 0 | 2.75 | 2.75 | 0 | 2.75 | 0 | 0 | V |
| 100 | P100_1 | ON | mid | mid | mid | mid | 0 | 0 | 0 | 0 | 0 | 0 | V |
| 100 | P100_2 | OFF | padv | padv | mid | padv-Vtp | 2.75 | 0 | 2.75 | 0.5 | 0.5 | 2.75 | V |
| 200 | P200_1 | OFF | mid | padv | padv | padv-Vtp | 2.75 | 0 | 2.75 | 0.5 | 0.5 | 2.5 | V |
| 200 | P200_2 | ON | padv | padv | padv | padv-Vtp | 2.75 | 0 | 2.75 | 2.5 | 0.5 | 0.5 | V |
| 200 | P200_3 | OFF | mid | padv | mid | mid | 0 | 2.75 | 2.75 | 0.5 | 0.5 | 2.25 | V |
| 200 | P200_4 | OFF | padv | padv | mid | mid | 2.75 | 0 | 2.75 | 2.75 | 0.5 | 2.25 | V |
| 200 | P200_5 | ON | 0 | mid | mid | 0 | 0 | 2.75 | 2.75 | 2.75 | 2.75 | 0 | V |
| 200 | N200_1 | ON | mid | padv | 0 | 0 | 2.75 | 0 | 2.75 | 0.5 | 2.75 | 0 | V |
| 200 | N200_2 | OFF | 0 | mid | 0 | 0 | 0 | 2.75 | 2.75 | 0.5 | 2.75 | 0 | V |
| 300 | N300_1 | ON | mid | mid-Vtn | padv | mid-Vtn | 2.75 | 0.5 | 3.25 | 0.5 | 0 | 3.25 | V |

FIG. 8

Logic Output of Output Buffer is set to Hi-Z since Vdd > mid, padv = 5.5 [V], protectv = Vdd = 3.3 [V], mid = 2.75 [V], Vtn = 0.5 [V], Vtp = 0.5 [V], Allowable Voltage Difference = 4.0 [V] and Vdd = 3.3 [V] (at operating state)

| Circuit | Element | Between Drain - Source | Voltage Of Each Electrode | | | | Voltage Difference (Absolute Value) | | | | | | Unit |
|---|---|---|---|---|---|---|---|---|---|---|---|---|---|
| | | | Gate | Drain | Source | Backgate | Vgs | Vgd | Vds | Vgb | Vdb | Vsb | |
| 10 | P10_1 | OFF | padv | padv | Vdd | Vdd-Vtn | 2.2 | 0 | 2.2 | 2.7 | 2.7 | 0.5 | V |
| 10 | N10_1 | ON | Vdd | padv | Vdd-Vtn | Vdd-Vtn | 0.5 | 2.2 | 2.7 | 0.5 | 2.7 | 0 | V |
| 10 | N10_2 | OFF | 0 | Vdd-Vtn | 0 | 0 | 0 | 2.8 | 2.8 | 0 | 2.8 | 0 | V |
| 20 | P20_1 | OFF | Vdd-Vtn | 0 | Vdd | Vdd | 0.5 | 2.8 | 3.3 | 0.5 | 3.3 | 0 | V |
| 20 | N20_1 | ON | Vdd-Vtn | 0 | 0 | 0 | 2.8 | 2.8 | 0 | 2.8 | 0 | V |
| 100 | P100_1 | OFF | Vdd | Vdd | mid | Vdd | 0.55 | 0 | 0.55 | 0 | 0 | 0.55 | V |
| 100 | P100_2 | ON | mid | Vdd | Vdd | Vdd | 0.55 | 0.55 | 0 | 0.55 | 0 | 0 | V |
| 200 | P200_1 | OFF | padv | padv | Vdd | padv-Vtp | 2.2 | 0 | 2.2 | 0.5 | 0.5 | 1.7 | V |
| 200 | P200_2 | ON | Vdd | padv | padv | padv-Vtp | 2.2 | 2.2 | 0 | 1.7 | 0.5 | 0.5 | V |
| 200 | P200_3 | OFF | padv | padv | Vdd | padv-Vtp | 2.2 | 0 | 2.2 | 0.5 | 0.5 | 1.7 | V |
| 200 | P200_4 | OFF | padv | padv | Vdd | Vdd | 2.2 | 0 | 2.2 | 0.5 | 0.5 | 0 | V |
| 200 | P200_5 | ON | 0 | Vdd | Vdd | Vdd | 3.3 | 3.3 | 0 | 3.3 | 0 | 0 | V |
| 200 | N200_1 | ON | Vdd | padv | padv | 0 | 0 | 2.2 | 2.2 | 3.3 | 2.2 | 0 | V |
| 200 | N200_2 | OFF | 0 | Vdd | 0 | 0 | 0 | 3.3 | 3.3 | 0 | 3.3 | 0 | V |
| 300 | N300_1 | ON | Vdd | Vdd-Vtn | padv | Vdd-Vtn | 2.2 | 0.5 | 2.7 | 0.5 | 0 | 2.7 | V |

FIG. 11

Output of Internal Logic is set 0 [V] since mid > Vdd, padv = 5.5 [V], Vdd = 0 [V], mid = protectv = 2.75 [V], Vtn = 0.5 [V], Vtp = 0.5 [V], Allowable Voltage Difference = 4.0 [V] and Vdd = protectselect = 0 [V] (at non-conductive state). P100_7 is deemed to an ideal switch with zero voltage drop between both ends.

| Circuit | Element | Between Drain - Source | Voltage Of Each Electrode | | | | Voltage Difference (Absolute Value) | | | | | Unit |
|---|---|---|---|---|---|---|---|---|---|---|---|---|
| | | | Gate | Drain | Source | Backgate | Vgs | Vgd | Vds | Vgb | Vdb | Vsb | |
| 100 | P100_1 | ON | Vdd | mid | mid | mid | 2.75 | 2.75 | 0 | 2.75 | 0 | 0 | V |
| 100 | P100_2 | OFF | mid | Vdd | mid | mid | 0 | 2.75 | 2.75 | 0 | 2.75 | 2.75 | V |
| 100 | P100_3 | ON | g100_3 | g100_3 | padv | padv | 0.69 | 0 | 0.69 | 0.69 | 0 | 0 | V |
| 100 | P100_4 | ON | g100_4 | g100_4 | g100_3 | g100_3 | 0.69 | 0 | 0.69 | 0.69 | 0.69 | 0 | V |
| 100 | P100_5 | ON | g100_5 | g100_5 | g100_4 | g100_4 | 0.69 | 0 | 0.69 | 0.69 | 0.69 | 0 | V |
| 100 | P100_6 | ON | g100_6 | g100_6 | g100_5 | g100_5 | 0.69 | 0 | 0.69 | 0.69 | 0.69 | 0 | V |
| 100 | P100_7 | ON | protectselect | mid | g100_6 | mid | 2.75 | 2.75 | 0 | 2.75 | 0 | 0 | V |
| 100 | P100_8 | ON | g100_8 | g100_8 | mid | mid | 0.69 | 0 | 0.69 | 0.69 | 0.69 | 0 | V |
| 100 | P100_9 | ON | g100_9 | g100_9 | g100_8 | g100_8 | 0.69 | 0 | 0.69 | 0.69 | 0.69 | 0 | V |
| 100 | P100_10 | ON | g100_10 | g100_10 | g100_9 | g100_9 | 0.69 | 0 | 0.69 | 0.69 | 0.69 | 0 | V |
| 100 | P100_11 | ON | 0 | 0 | g100_10 | g100_10 | 0 | 0 | 0 | 0 | 2.75 | 0 | V |
| 100 | N100_1 | OFF | 0 | mid | 0 | 0 | 0 | 2.75 | 2.75 | 0 | 2.75 | 0 | V |

FIG. 13

Through Current Reduction Operation since Vdd > mid, padv = 5.5 [V], protectv = Vdd = 3.3 [V], mid = 2.75 [V], Vtn = 0.5 [V] Allowable Voltage Difference = 4.0 [V] and protectselect = 3.3 [V] (at operating state)

| Circuit | Element | Between Drain - Source | Voltage Of Each Electrode | | | | Voltage Difference (Absolute Value) | | | | | | Unit |
|---|---|---|---|---|---|---|---|---|---|---|---|---|---|
| | | | Gate | Drain | Source | Backgate | Vgs | Vgd | Vds | Vgb | Vdb | Vsb | |
| 100 | P100_1 | ON | Vdd | mid | mid | mid | 3.3 | 3.3 | 0 | 3.3 | 0 | 0 | V |
| 100 | P100_2 | OFF | mid | Vdd | mid | mid | 0 | 3.3 | 3.3 | 0 | 3.3 | 0 | V |
| 100 | P100_3 | ON | g100_3 | g100_3 | padv | padv | 0.5 | 0 | 0.5 | 0.5 | 0.5 | 0 | V |
| 100 | P100_4 | ON | g100_4 | g100_4 | g100_3 | g100_3 | 0.5 | 0 | 0.5 | 0.5 | 0.5 | 0 | V |
| 100 | P100_5 | ON | g100_5 | g100_5 | g100_4 | g100_4 | 0.5 | 0 | 0.5 | 0.5 | 0.5 | 0 | V |
| 100 | P100_6 | ON | g100_6 | g100_6 | g100_5 | g100_5 | 0.5 | 0 | 0.5 | 0.5 | 0.5 | 0 | V |
| 100 | P100_7 | OFF | protectselect | mid | g100_6 | g100_6 | 0.2 | 3.3 | 3.5 | 0.2 | 3.5 | 0 | V |
| 100 | P100_8 | OFF | g100_9 | g100_8 | mid | mid | 0 | 0 | 0 | 0 | 0 | 0 | V |
| 100 | P100_9 | OFF | g100_9 | g100_9 | g100_8 | g100_8 | 0 | 0 | 0 | 0 | 0 | 0 | V |
| 100 | P100_10 | OFF | g100_10 | g100_10 | g100_9 | g100_9 | 0 | 0 | 0 | 0 | 0 | 0 | V |
| 100 | P100_11 | OFF | 0 | 0 | g100_10 | g100_10 | 0 | 0 | 0 | 0 | 0 | 0 | V |
| 100 | N100_1 | ON | protectselect | 0 | 0 | 0 | 3.3 | 3.3 | 0 | 3.3 | 0 | 0 | V |

SEMICONDUCTOR DEVICE

CROSS-REFERENCE TO RELATED APPLICATIONS

The disclosure of Japanese Patent Application No. 2019-159569 filed on Sep. 2, 2019 including the specification, drawings and abstract is incorporated herein by reference in its entirety.

BACKGROUND

The present disclosure relates to semiconductor devices, for example, to a semiconductor device having an input protection circuit of high voltage resistance (so-called input tolerant function).

Transistors used in semiconductor integrated circuits are becoming finer year by year. For this reason, even transistors for IF (Interface) applications are increasingly being manufactured with their withstand performance below the voltage used in IF. One reason for this is that the IF standard itself is not significantly renewed with respect to the evolution of the manufacturing process.

Tolerant buffers are buffer circuits that, in such cases, allow the input signal of signals having an amplitude greater than the power supply voltage of a semiconductor integrated circuit.

There is a disclosed technique listed below.
[Patent Document 1] U.S. Pat. No. 6,150,843
For example, U.S. Pat. No. 6,150,843 (Patent Document 1) discloses an exemplary tolerant I/O (Input and Output) buffer.

SUMMARY

The operation of the conventional tolerant buffer as shown in Patent Document 1 above, it is assumed that the power supply for driving the semiconductor integrated circuit is active.

Therefore, from the request of power saving, a problem that the tolerant function does not operate when the power supply of the semiconductor integrated circuit is turned off occurs.

Other problems and novel features will become apparent from the description herein and from the accompanying drawings.

In the semiconductor device of an embodiment, the tolerant buffer operates by the larger of the split voltage and the power supply voltage obtained by dividing the voltage applied to the pad for external connection.

According to the above-described embodiment, the tolerant buffer can protect the internal circuit even when the power supply voltage is turned 0 [V].

BRIEF DESCRIPTION OF THE DRAWINGS

FIG. 2A is a diagram illustrating a first example in which the input voltage from the outside is higher than the power supply voltage for driving the IC (Integrated Circuit).

FIG. 7 is a diagram showing the voltage difference between the electrodes of each transistor in tabular form when the intermediate voltage mid is greater than the power supply voltage Vdd.

FIG. 8 is a diagram showing the voltage difference between the electrodes of each transistor in tabular form when the power supply voltage Vdd greater than the intermediate voltage mid.

FIG. 11 is a diagram showing a voltage difference between the electrodes of the transistors corresponding to the pad voltage padv in tabular form when the power supply voltage Vdd is 0 [V].

FIG. 13 is a diagram showing the voltage difference between the electrodes of the transistors according to the protection voltage protectv in tabular form when the power supply voltage Vdd is 3.3 [V].

DETAILED DESCRIPTION

Figure 1:
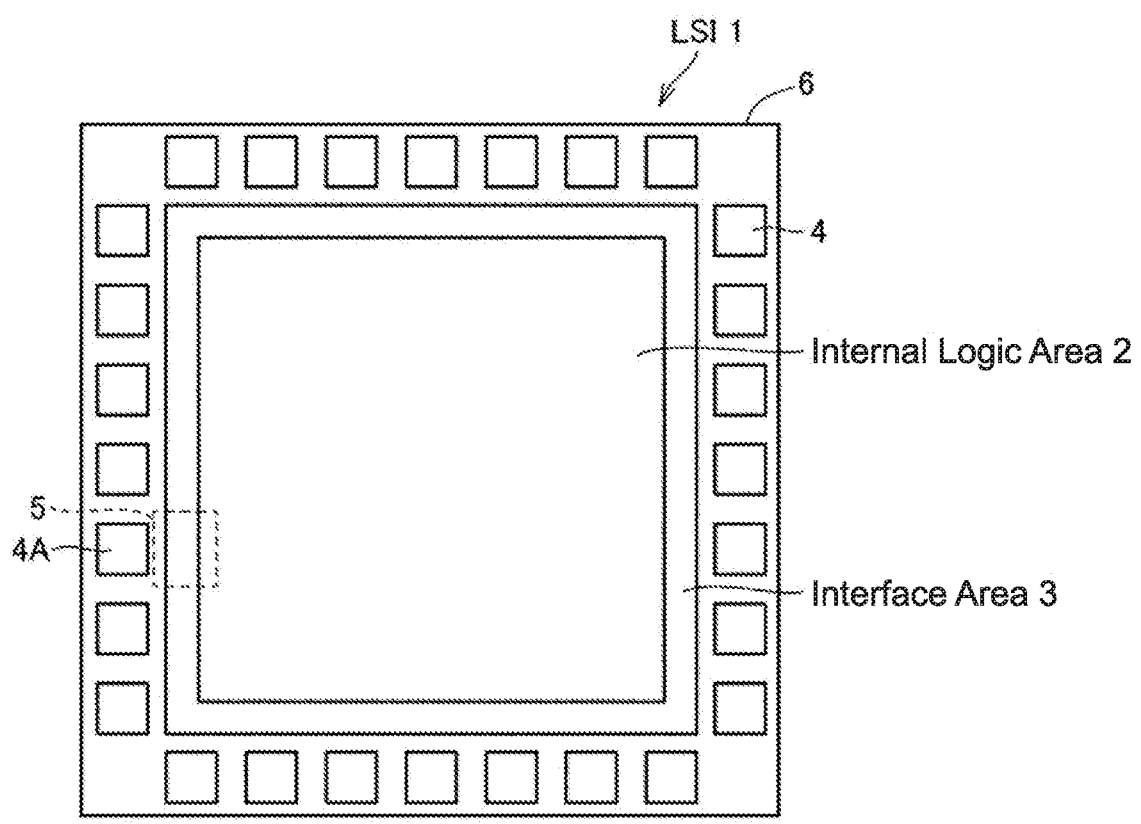
FIG. 1 is a plan view schematically showing a configuration of the LSI.

Hereinafter, each embodiment will be described in detail with reference to the drawings. NMOS(Negative-Channel Metal Oxide Semiconductor) transistors are exemplified below as examples of N-channel transistors. And, PMOS (Positive-Channel Metal Oxide Semiconductor) transistor as an example of the transistor of the P-channel is mentioned as an example. However, the structure of the transistor is not limited to the MOS structure, but is not limited to FETs (Field Effect Transistor). Accordingly, in the present disclosure, more generally, N-channel FETs and the like are collectively referred to as N-type transistors, P-channel FETs and the like may be collectively referred to as P-type transistors.

Further, when not limited to any of N-type and P-type, simply referred to as a transistor.

In the following description, the same or corresponding parts are denoted the same reference numerals, and description thereof may not be repeated.

(First Embodiment) (Overall configuration of the semiconductor device) FIG. 1 is a plan view schematically showing the configuration of the LSI. Referring to FIG. 1, LSI (Large Scale Integration) 1 includes an internal logic circuit disposed on the main surface of the substrate 6, and a plurality of pads 4 disposed on the peripheral portion thereof on the main surface.

LSI1 further includes an interfacing region 3 disposed between the inner logic region 2 and the plurality of pads 4. The interface region 3 includes a buffer circuit for transmitting signals input from the outside to the pad 4 to the internal logic region 2 or for outputting signals from the internal logic region 2 to the outside through the pad 4.

Tolerant buffer 5 is obtained by adding an internal protection circuit to the buffer circuit. Thus, even when a voltage higher than the power supply voltage is applied the corresponding pad 4A, the buffer circuit and the internal logic region 2 can be protected. In particular, the tolerant circuit 5 of the present embodiment is configured to protect the buffer circuit and the internal logic region 2 of the interface region 3 even when the power supply voltage for driving LSI1 is not supplied.

Figure 2B:
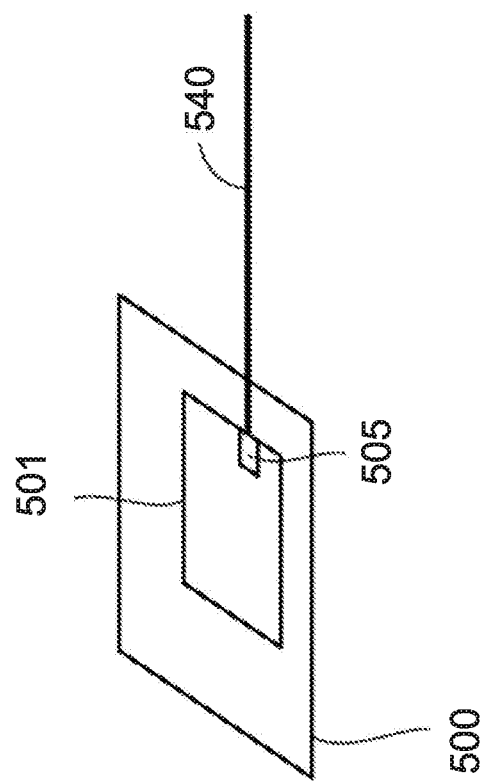
FIG. 2B is a diagram illustrating a second example in which the input voltage from the outside is higher than the power supply voltage for driving the IC (Integrated Circuit).

(Example where a tolerant buffer is required) FIG. 2A and FIG. 2B are diagrams illustrating an example in which the input voltage from the outside is higher than the power supply voltage for driving the IC (Integrated Circuit). Hereinafter, a case where the tolerant buffer 5 is necessary will be described in detail with reference to FIG. 2.

Referring to FIG. 2A, IC501 is mounted on a board 500 (hereinafter, referred to as a 3.3 [V] board 500) provided with a 3.3 [V] power source. IC501 operates at the power supply voltage of 3.3 [V]. On the other hand, the board 530 (hereinafter, referred to as 5 [V] board 530) with the power supply of 5 [V], IC531 is mounted. IC531 operates at the power supply voltage of 5 [V]. These IC501 and IC503 with differing power supply voltages are interconnected via signaling lines 540.

In the above-described configuration, the tolerant buffer 505 needs to be provided in the lower IC501 of the power supply voltage. This is because the high-level voltage of the signal outputted from IC531 becomes 5 [V] and exceeds the withstand voltage of IC501 of the power supply voltage 3.3 [V].

Referring to FIG. 2B, a PCI (Peripheral Component Interconnect) standard signal line 540 is connected to 10501 mounted on 3 [V] board 500. Since the voltage level of the signal line 540 of the PCI standard is determined in 5 V by the standard, it exceeds the withstand voltage of 10501 of the power supply voltage 3.3 V. Therefore, IC501 needs to be provided with a tolerant buffer 505.

Figure 3:
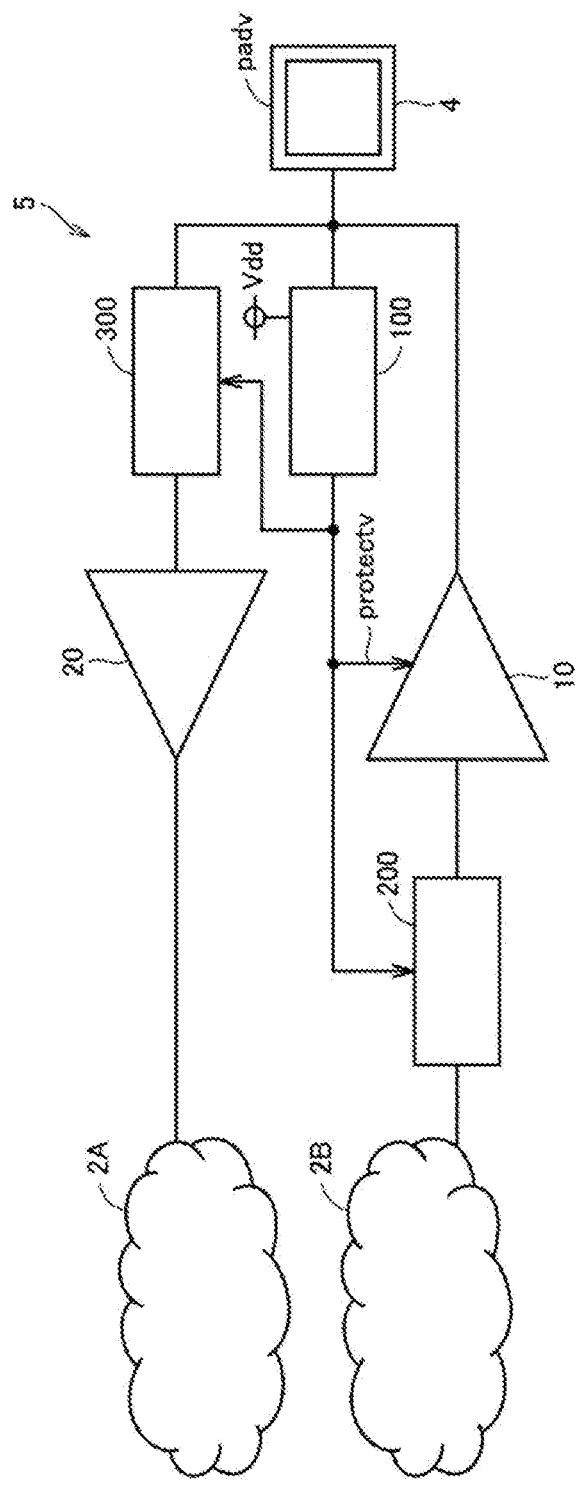
FIG. 3 is a block diagram showing a schematic configuration of a tolerant buffer of FIG. 1.

(Summary of Tolerant Buffer) FIG. 3 is a block diagram showing a schematic configuration of the tolerant buffer of FIG. 1. Referring to FIG. 3, the tolerant buffer 5 includes an output buffer 10, an input buffer 20, a protection voltage generation circuit 100, and a protection circuit 200,300.

The output buffer 10, during output operation, based on the output signal from the internal logic circuit 2B, drives an external circuit (not shown) connected to the corresponding pads 4. The output buffer 10 is provided to improve the current drive capability.

The input buffer 20 drives a corresponding internal logic circuitry 2A based on signals externally input to the pad 4 during input operation. The input buffer 20 is provided for shaping the input signal as well as enhancing the current drive capability.

The protection voltage generating circuit 100 compares the intermediate voltage mid obtained by dividing the voltage padv input to the pad 4 with the power supply voltage Vdd. The protection voltage generator 100 outputs the larger of the intermediate voltage mid and the power supply voltage Vdd as the protection voltage protectv. In the present disclosure, the voltage inputted to the pad 4 is referred to as a pad voltage padv, and the intermediate voltage mid is also referred to as a divided voltage.

The protection circuit 200 protects the output buffer 10 and the internal logic circuit 2B when a high voltage is applied to the pad 4 (i.e., when the pad voltage padv is greater than the protection voltage protectv). Protection circuit 200 uses a protection voltage protectv as the operating power supply. Accordingly, the protection circuit 200 is operable even if the power supply voltage Vdd is 0 [V].

The protection circuit 300 protects the input buffer 20 when a high voltage is applied to the pad 4, that is, when the pad voltage padv is higher than the protection voltage protectv. Protection circuit 300 uses a protection voltage protectv as the operating power supply. Accordingly, the protection circuit 300 is operable even if the power supply voltage Vdd is 0 [V].

Figure 4:
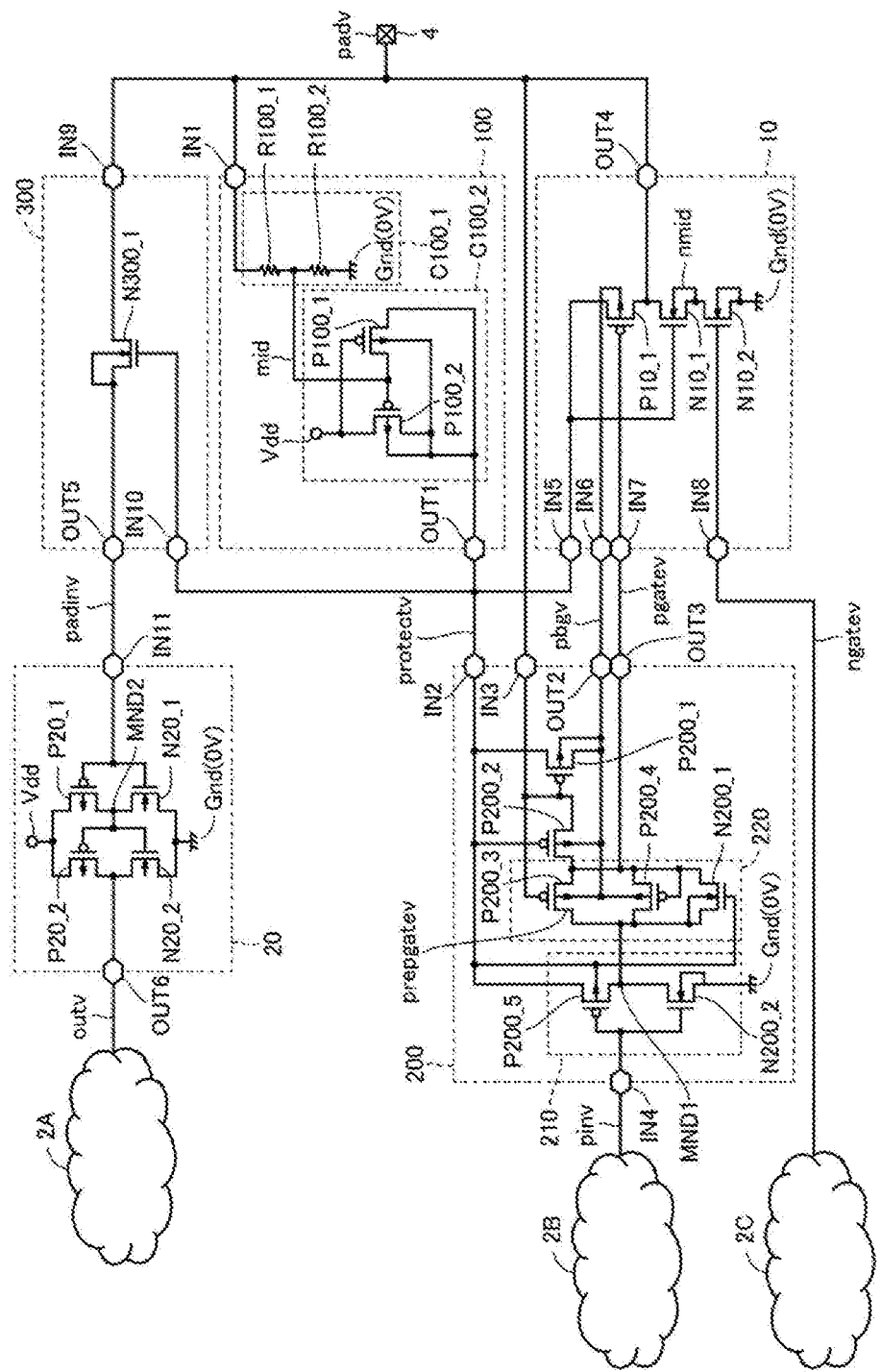
FIG. 4 is a circuit diagram showing an example of a detailed configuration of the tolerant buffer of FIG. 3.

(Detailed Tolerant Buffer Configuration) FIG. 4 is a circuit diagram showing an example of a detailed configuration of the tolerant buffer of FIG. 3. In FIG. 4, the power supply voltage supplied to the tolerant buffer 5 is referred to as Vdd, and the ground voltage is referred to as Gnd. A node to which the power supply voltage Vdd is applied is referred to as a Vdd node, and a node to which the ground voltage Gnd is applied is referred to as a Gnd node. Each of the internal logic circuit 2A,2B,2C of FIG. 4 corresponds to the internal logic region 2 of FIG. 1.

As described above, the pad voltage padv inputted to the pad 4 may be larger than the power supply voltage Vdd. Further, the operational ranges of the transistors constituting the tolerant buffer 5 are smaller than the maximum value of the voltage padv inputted to the pads 4. Therefore, when the buffer circuit 5 does not have the tolerant function, the following problem occurs. First, through the parasitic diodes of PMOS transistor, a problem that an abnormal current flows from the pad 4 to the Vdd-node occurs. Second, since the voltage above the withstand voltage is applied to the gate oxide film of the transistor, a problem occurs in the reliability of the gate oxide film.

As will be described in detail below, the tolerant buffer 5 of the present embodiment is configured so that the above problem does not occur even when the power supply voltage Vdd is 0 [V]. Hereinafter, the configuration and operation of each functional block constituting the tolerant buffer 5 will be described in detail with reference to FIG. 4.

(Configuration and operation of the protection voltage generating circuit) The protection voltage generation circuit 100 includes an input node IN1, an output node OUT?, a circuit C100_1, and a circuit C100_2.

The input nodes IN1 are connected to the corresponding pads 4. The protection voltage generating circuit 100, the pad voltage padv via the input node IN1 is input. Further, the protection voltage generating circuit 100 outputs the generated protection voltage protects from the output node OUT?. In the following explanation, the output node OUT1 is also referred to as a protectv node.

The circuit C100_1 generates the intermediate voltage mid by dividing the pad voltage padv. The intermediate voltage mid is a voltage above the ground voltage Gnd (0 [V]) and below the pad voltage padv. That is, the intermediate voltage mid, Padv≥mid≥Gnd . . . (1) Always satisfy. In the above equation (1), the equal sign is established when padv=Gnd=0 [V].

Even if the pad voltage padv is at the maximum voltage, the intermediate voltage mid is set so that the voltage of each electrode of each transistor falls within the operable range and the voltage between the electrodes of each transistor falls within the rating. For example, the operational ranges of the respective transistors are set to 4.0 [V], the maximum value of the pad voltage padv is set to 5.5 [ ], and the voltage division ratio of the circuit C100_1 is set to 0.5. Since the intermediate voltage mid is 5.5×0.5=2.75 [V], the intermediate voltage mid falls within the operational range of the transistor.

The circuit C100_1 of FIG. 4 includes resistive elements R100_1 and R100_2 connected in series between an input node IN1 and a ground node. An intermediate voltage mid is output from a connection node between the resistor element R100_1 and the resistance element R100_2. In the following description, a connection node between the resistive element R100_1 and the resistive element R100_2, that is, a node having the intermediate voltage mid is referred to as a mid node or a resistor dividing node. In order to reduce the current flowing between the pad 4 and the Gnd node, the resistance values of the resistance elements R100_1 and R100_2 are preferably 100 kΩ or more.

The power supply voltage Vdd and the intermediate voltage mid from the circuit C100_1 are input to the circuit C100_2. The intermediate voltage mid falls within the operational range of the circuit C100_2. The circuit C100_2 outputs the larger one of the power supply voltage Vdd and the intermediate voltage mid as the protection voltage protectv. The circuit C100_2 includes, for example, PMOS transistors P100_1 and P100_2.

The source of PMOS transistor P100_1 is connected to the mid node, the gate is connected to the Vdd node, and the drain and the back gate are connected to the output node OUT1. The source of PMOS transistor P100_2 is connected to the Vdd node, the gate is connected to the mid node, and the drain and the back gate are connected to the output node OUT1.

First, a case where the intermediate voltage mid is larger than the power supply voltage Vdd (mid>Vdd) will be described. Here, the source voltage of PMOS transistor P100_1 is higher than the gate voltage, and the gate voltage of PMOS transistor P100_2 is higher than the source voltage. Therefore, PMOS transistor P100_1 is turned on, and PMOS transistor P100_2 is cut off. As a result, the intermediate voltage mid is output from the output node OUT1 as the protection voltage protectv.

On the other hand, a case where the power supply voltage Vdd is larger than the intermediate voltage mid (Vdd>mid) will be described. Here, the gate voltage of PMOS transistor P100_1 is larger than the source voltage, and the source voltage of PMOS transistor P100_2 is larger than the gate voltage. Therefore, PMOS transistor P100_1 is cut off, and PMOS transistor P100_2 is turned on. As a result, the power supply voltage Vdd is output from the output node OUT1 as the protection voltage protectv.

Figure 5:
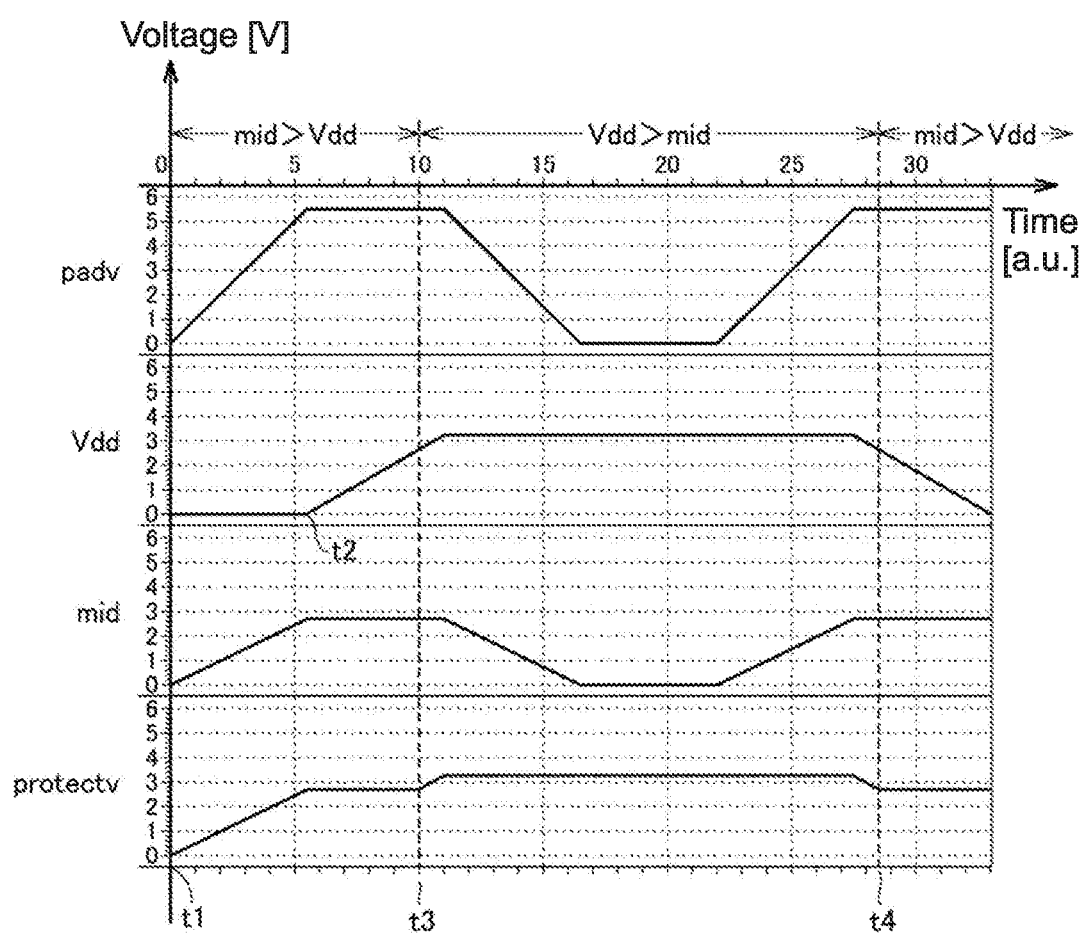
FIG. 5 is a diagram showing a simulation result, of a protection voltage generating circuit.

FIG. 5 is a diagram showing a simulation result of a protection voltage generating circuit. FIG. 5 shows time changes of the pad voltage padv, the power supply voltage Vdd, the intermediate voltage mid, and the protection voltage protectv in this order from the top. The horizontal axis of the graph shown in FIG. 5 is a time axis, the unit is an optional unit (a.u.: arbitrary unit).

The pad voltage padv varies from 0 [V] to 5.5 [V]. The power supply voltage Vdd changes in the range of 0 [V] to 3.3 [ ]. Assuming that the voltage division ratio of the circuit C100_1 is 0.5, the Intermediate voltage mid is equal to ½ of the pad voltage padv.

In FIG. 5, since the intermediate voltage mid is larger than the power supply voltage Vdd from time t1 to time t3 and after time t4, the protection voltage protectv follows the intermediate voltage mid. That is, protectv=mid. Note that between time t1 and time t2, the power supply voltage Vdd is 0 [V], but the protection voltage protectv generated by the protection voltage generator 100 is greater than 0 [V].

On the other hand, since the power supply voltage Vdd is larger than the intermediate voltage mid between the time t3 and the time t4, the protection voltage protectv follows the power supply voltage Vdd. That is, protectv=Vdd.

(Input Buffer Configuration) Referring to FIG. 4, the input buffer 20 includes, by way of example, an input node IN11, an output node OUT6, and two inverters in cascade. The input node IN11 of the input buffer 20, the input signal padinv is input via a pad 4 and the protection circuit 300. From the output node OUT6 of the input buffer 20 to the internal logic circuit 2A, a signal outv based on the input signal padinv is output.

More specifically, the input buffer 20 includes a PMOS transistor P20_1 and a NMOS transistor N20_1 as inverters of a preceding stage. The input buffer 20 further includes a PMOS transistor P20_2 and a NMOS transistor N20_2 as subsequent inverters. Hereinafter, these connection relationships will be described.

The respective sources of PMOS transistors P20_1,P20_2 are connected to the Vdd-nodes. The gate of PMOS transistor P20_1 and the rate of NMOS transistor N20_1 are connected to the input node IN11. Sources of NMOS transistors N20_1 and N20_2 are connected to the ground nodes. The drain of PMOS transistor P20_1 and the drain of NMOS transistor N20_1 are connected to the gate of PMOS transistor P20_2 and the gate of NMOS transistor N20_2. In FIG. 4, these shared nodes are shown as intermediate nodes MND2. The drain of PMOS transistor P20_2 and the drain of NMOS transistor N20_2 are connected to the output-node OUT6.

(Configuration and Operation of Protection Circuit for Input Buffer) The logic signal input from the outside to the pad 4 is input to the internal logic circuit 2A through the protection circuit 300 and the input buffer 20 in this order. Protection circuit 300 is a protection circuit for accommodating the voltage between the gate and source of each transistor constituting the input buffer 20 within the rating even when a high voltage is applied to the pad 4.

The protection circuit 300 includes an input node IN9, IN10, an output node OUT5, and a NMOS transistor N300_1. The sources of NMOS transistors N300_1 are connected to the pads 4 via the input nodes IN9. The protection voltage protectv is input to the gate of NMOS transistor N300_1 through the input node IN10. The drains and back gates of NMOS transistors N300_1 are connected to the input node IN11 of the input buffers 20 via the output node OUT5.

Note that the allowable voltage between the back gate source and the back gate drain is generally greater than the allowable voltage between the other electrodes. Therefore, the back-gate of NMOS transistor N300_1 can be connected to the ground node depending on the magnitude of the allowable voltage.

Next, the operation of the protection circuit 300. The protection voltage protectv is inputted to the gate of NMOS transistor N300_1. The voltage of the drain of NMOS transistor N300_1 is limited to be equal to or lower than the protection voltage protectv even if the pad voltage padv is higher than the protection voltage protectv. To be precise, when the threshold voltage of NMOS transistor N300_1 is Vtn, the drain voltage is limited to protectv-Vtn at most. Thus, the high-level voltage of the input signal padinv to be input to the input buffer 20 is also the protection voltage protectv at most (accurately, protectv-Vtn). As a result, the voltage difference between the electrodes of each transistor constituting the input buffer 20 can all be within the rating.

(Output Buffer Configuration) The output buffer 10 includes an input node IN5~IN8, an output node OUT4, a PMOS transistor P10_1, and NMOS transistors N10_1 and N10_2. Hereinafter, these connection relationships will be described.

The sources of PMOS transistor P10_1 and the gates of NMOS transistor N10_1 are connected to the input-node IN5. The input-node IN5 is populated with the protection-voltage protectv.

The back-gate of PMOS transistor P10_1 is connected to the input-node IN6. The input node IN6 is connected to the output node OUT2 of the protection circuit 200. In FIG. 4, the voltage of the input node IN6 and the output node OUT2 is referred to as a back-gate voltage pbgv.

The gate of PMOS transistor P10_1 is connected to the input node IN7. The input node IN7, the gate control signal pgatev is input from the internal logic circuit 2B through the protection circuit 200.

The drain of PMOS transistor P10_1 and the drain of NMOS transistor N10_1 are connected to the output node OUT4. Output nodes OUT4 are connected to pads 4.

The sources and back gates of NMOS transistors N10_1 and the drains of NMOS transistors N10_2 are connected to the intermediate nodes nmid. The source of NMOS transistor N10_1 is connected to the ground node.

The gate of NMOS transistor N10_1 is connected to the input node IN8. The input node IN8, the gate control signal ngatev is input from the internal logic circuit 2C.

(Configuration of Protection Circuit for Output Buffer) Signals output from the internal logic circuit 21 during normal operation are propagated to the pads 4 through the protection circuit 200 and the output buffer 10. That is, the protection circuit 200 is a circuit for transmitting a signal output from the internal logic circuit 2B to the gate of PMOS transistor P10_1 during normal output operation.

On the other hand, the protection circuit 200, when a high voltage is applied to the pad 4, to prevent the propagation of high voltage to the inner logic circuit 2B. Furthermore, the protection circuit. 200 causes the gate voltage of PMOS transistor P10_1 to follow the pad voltage padv when a high voltage is applied to the pad 4. As a result, PMOS transistor P10_1 is turned off to prevent an abnormal current from flowing from the pad 4 to the Vdd node.

The protection circuit 200 includes, for example, an input node IN2~IN4, an output node OUT2,OUT3, and PMOS transistors P200_1 and P200_2. Protection circuit 200 further includes an inverter 210 and a transfer gate 220. As shown in FIG. 4, the inverter 210 includes a PMOS transistor P200_5 and a NMOS transistor N200_2. The transfer gate 220 includes PMOS transistors P200_3 and P200_4 and a NMOS transistor N200_1.

Hereinafter, these connection relationships will be described.

A source of PMOS transistor P200_1, a gate of PMOS transistor P200_2, and a source and a back gate of PMOS transistor P200_5 are connected to the input node IN2. Further, the gate of NMOS transistor N200_1 is connected to the input node IN2. The input-node IN2 is populated with the protection-voltage protectv.

The gate of PMOS transistor P200_1, the source of PMOS transistor P200_2, and the gate of PMOS transistor P200_3 are input to the input node IN3. The input nodes IN3 are connected to the pads 4.

The drains and the bag gates of PMOS transistors P200_1 and the back gates of PMOS transistors P200_2, P200_3, and P200_4 are connected to the output node OUT2. The voltage of the output-node OUT2 is equal to the back-gate voltage pbgv described above.

The drains of PMOS transistors P200_2 and P200_3 and the gates and drains of PMOS transistors P200_4 are connected to the output node OUT3. The drain of NMOS transistor N200_1 is also connected to the output node OUT3. The aforementioned gate control signal pgatev is output from the output node OUT3.

The sources of PMOS transistors P200_3 and P200_4 and the sources and back gates of NMOS transistor N200_1 are connected to the intermediate nodes MND1. The intermediate-node MND1 is further connected to the drain of PMOS transistor P200_5 and the drain of NMOS transistor N200_2. Let prepgatev be the voltage of the intermediate nodes MND1. The sources and back gates of NMOS transistors N200_2 are connected to the ground nodes.

The gate of PMOS transistor P200_5 and the gate of NMOS transistor N200_2 are connected to the input node IN4. The input node IN4, the output signal pinv is input from the internal logic circuit 2B.

(Operation of Protection Circuit for Output Buffer) Next, the operation of the protection circuit 200. In a normal outputting operation in which a high voltage is not applied to the pads 4, PMOS transistor P200_1 is conductive. In this instance, the protection voltage protectv(=pbgv) is inputted to the back-gate of PMOS transistor P10_1 through the channels of PMOS transistor P200_1. That is, in the normal outputting operation, PMOS transistor P200_1 is a power supply path of the back-gate voltage pbgv of PMOS transistor P10_1.

When a high voltage is applied to the pad 4, the protection voltage protectv (=mid) is input to the source of PMOS transistor P200_1, and the pad voltage padv is input to the gate thereof. Therefore, PMOS transistor P200_1 is rendered non-conductive when padv>protectv. As a result, the pad voltage padv flowing in through the parasitic diode of PMOS transistor P10_1 can be prevented from reaching the Vdd node through PMOS transistor P200_1.

In a normal outputting operation in which a high voltage is not applied the pads 4, PMOS transistor P200_2 is turned off. On the other hand, when a high voltage is applied to the pad 4, as shown in FIG. 6, PMOS transistor P200_2 becomes conductive and supplies the pad voltage padv to the gate of PMOS transistor P10_1.

Figure 6:
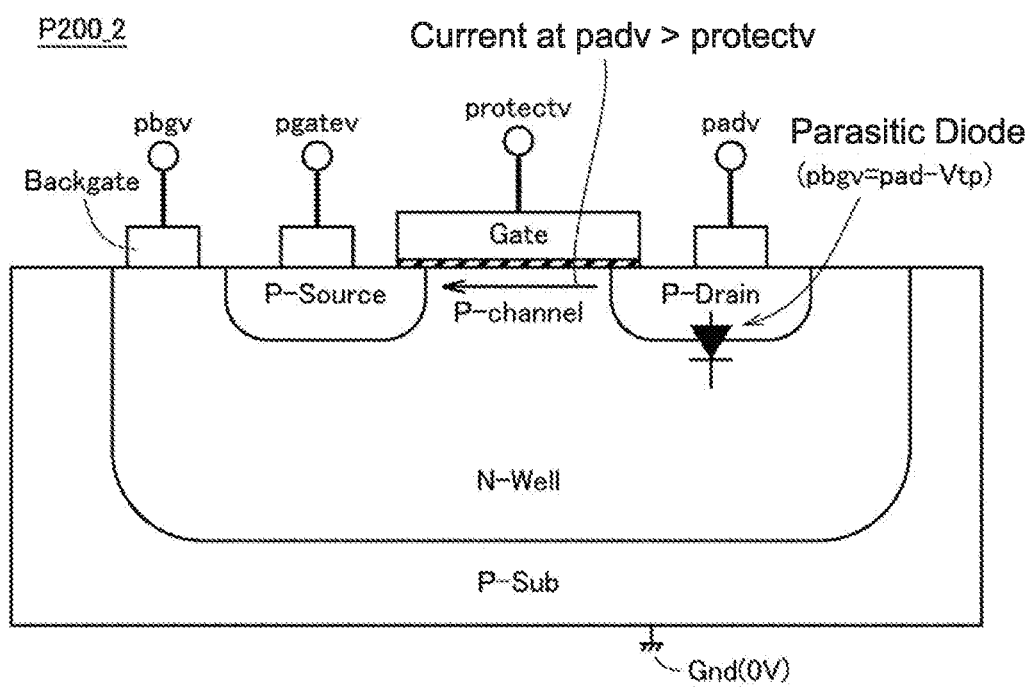
FIG. 6 is a diagram bowing an operation of PMOS transistor P200_2 when a high voltage is applied to the pads

FIG. 6 is a diagram for explaining the operation of PMOS transistor P200_2 when a high voltage is applied to the pads. Since the P-type substrate (P-Sub) ground voltage Gnd is supplied, between the P-type substrate and the N-type well (N-Well) is non-conductive.

As shown in FIG. 6, the P-type drain (P-Drain) pad voltage padv is supplied, the protection voltage protectv is input to the gate (Gate). The pad voltage padv is padv>protectv of the protection voltage protectv. Therefore, PMOS transistor P200_2 becomes conductive, and a channel current flows through the P-channel P-channel. As a result, the voltage (pgatev) of the P-type source (P-Source) becomes substantially equal to the pad voltage padv. As a result, the pad voltage padv is supplied to the gate of PMOS transistor P10_1 constituting the output buffer 10. Since the protection voltage protectv is supplied to the sources of PMOS transistors P10_1, PMOS transistors P10_1 are turned off.

Furthermore, as shown in FIG. 6, the parasitic diode between the P-type drain and the N-type well becomes conductive. As a result, the voltage pbgv of the back-gate Backgate of PMOS transistor P200_2 follows the pad voltage padv. To be precise, the back-gate voltage pbgv is equal to padv-Vtp, where V tp is the threshold voltage.

As described above, in padv>protectv, the voltages of the electrodes of PMOS transistors P200_1 and P200_2 are either the pad voltage padv or the protection voltage protectv. Therefore, the voltage difference between any of the electrodes of each of PMOS transistors P200_1 and P200_2 can be kept within the rating.

Referring again to FIG. 4, the transfer gate 220 operates as a slew circuit that propagates the input signal from the internal logic circuit 2B during normal output operation where no high voltage is applied to the pad 4.

On the other hand, the transfer gate 220 operates as a protection circuit that does not allow the pad voltage padv to wrap around the inner logic circuit 2B when a high voltage is applied to the pad 4. Specifically, in padv>protectv, the pad voltage padv is supplied to the gates of PMOS transistors P200_3 and P200_4. Therefore, PMOS transistors P200_3 and P200_4 are turned off. Since the protection voltage protectv is supplied to the gate of NMOS transistor N200_2, NMOS transistor N200_2 is turned on. However, the source voltage prepgatev of NMOS transistor N200_2 does not rise above the protection voltage protectv. Consequently, the voltage of each electrode of the transistor constituting the transfer gate 220 is either the pad voltage padv or the protection voltage protectv. Thus, the voltage difference between the electrodes of each transistor can also be within the rating.

The largest voltage supplied to the electrodes of PMOS transistor P200_5 and NMOS transistor N200_2 included in the inverters 210 is the protection voltage protectv. Therefore, the voltage difference between the electrodes of each transistor constituting the inverter 210 falls within the rating.

The protection voltage protectv is supplied to the back-gate of PMOS transistor P200_5. Here, as described above, the protection voltage protectv may be supplied to the intermediate node MND1 through NMOS transistor N200_1.

However, the drain-side parasitic diodes of PMOS transistor P200_5 do not conduct. Therefore, no abnormal current is supplied to the internal power supply. As long as the protection voltage protectv is supplied to the back-gate of PMOS transistor P200_5, other circuits may be used instead of the inverters 210.

(Summary of output buffer protection) Protection of the output buffer 10 will be summarized based on the configuration of the protection circuit 200 described above.

When a high voltage is applied to the pad 4 (padv>protectv), the gate of PMOS transistor P10_1, the pad voltage padv is supplied through the protection circuit 200. Therefore, PMOS transistor P10_1 is turned off.

Similarly to PMOS transistor P200_2, PMOS transistor P10_1 has its drain supplied with the pad voltage padv. Thus, the voltage (pbgv) of the back-gate of PMOS transistor P10_1 follows the pad voltage padv (precisely, padv-Vtp) through the drain-side parasitic diode.

Similarly to NMOS transistor N300_1, the protection voltage protectv is supplied to the gate of NMOS transistor N10_1. Therefore, even if the pad voltage padv is inputted to the drain of NMOS transistor N10_1, the voltage of the source of the intermediate node nmid is limited to the protection voltage protectv. To be precise, when the threshold voltage of NMOS transistor N10_1 is Vtn, the voltage of the intermediate node nmid is limited to protectv-Vtn.

Therefore, the voltages of the electrodes of PMOS transistor P10_1 and NMOS transistor N10_1 become either the pad voltage padv or the protection voltage protectv. Therefore, the voltage difference between the electrodes of these transistors can be within the rating.

Finally, the voltage of the drain (intermediate node nmid) of NMOS transistor N10_2 is at most the protection voltage protectv (to be precise, protectv-Vtn). Thus, the voltage difference between the electrodes of NMOS transistor N10_2 can all be within the rating.

(Specific example of the voltage difference between the electrodes of the transistor) Hereinafter, with reference to specific numerical examples, further illustrating the circuit operation.

FIG. 7 is a diagram showing, in tabular form, the voltage difference between the electrodes of each transistor when the intermediate voltage mid is greater than the power supply voltage Vdd.

In FIG. 7, the pad voltage padv is set to 5.5 [ ], and the power supply voltage Vdd is set to 0V. When the voltage division ratio of the circuit C100_1 is 0.5, the intermediate voltage mid=protection voltage protectv is 2.75V. The threshold voltage Vtn of NMOS transistor is set to 0.5 [V], and the threshold voltage Vtp of PMIS transistor is set to 0.5 [V]. The allowable voltage difference between the electrodes of the transistors shall be 4.0 [V]. Since the power supply voltage Vdd is 0V, the output from the internal logic circuit is 0 [V].

The symbols used in FIG. 7 are the same as in FIG. 4. As the voltage difference between the electrodes, the gate-source voltage Vgs, the gate-drain voltage Vgd, the drain-source voltage ands are shown. Furthermore, as the voltage difference between the electrodes, the gate-back gate voltage Vgb, the drain-back gate voltage Vdb, the source-back gate voltage Vsb are shown. As shown in FIG. 7, the absolute value of the voltage difference between these electrodes is 3.25 [V] at the maximum, which is within the range of the allowable voltage difference.

FIG. 8 is a diagram showing the voltage difference between the electrodes of each transistor in tabular form when the power supply voltage Vdd is greater than the intermediate voltage mid.

In FIG. 8, the pad voltage padv is set to 5.5 [V], and the power supply voltage Vdd (=protection voltage protects; is set to 3.3 [V]. Assuming that the voltage division ratio of the circuit C100_1 is 0.5, the intermediate voltage mid is 2.75 [V]. The threshold voltage Vtn of NMOS transistor is set to 0.5 [V], and the threshold voltage Vtp of PMOS transistor is set to 0.5 [V]. The allowable voltage difference between the electrodes of the transistors shall be 4.0 [V]. Since the power supply voltage Vdd is 3.3 [V], the logic circuitry inside is operating. It is assumed that the output of the output buffer 10 is in a high impedance state. The symbols used in FIG. 8 are the same as in FIG. 7.

As shown in FIG. 8, the voltage difference (absolute value) between the electrodes is at most 3.3 [V], which is within the allowable voltage difference.

(Effects of the First Embodiment) In the conventional tolerant buffer, the voltage required for the tolerant function is supplied by the power supply voltage Vdd of the LSI. For this reason, the protection of the LSI depended on the state of the power supply, and the tolerant function did not work when the power supply was cut off. On the other hand, the tolerant buffer of the first embodiment includes a protection voltage generation circuit 100. The protection voltage generating circuit 100 can generate a protection voltage protects necessary for operation of the tolerant buffer by utilizing the voltage supplied from the external circuit to the LSI. Thus, even when the power supply for the LSI is cut off for power saving, it can protect the LSI.

Second Embodiment In the second embodiment, the configuration of the circuit C100_1 in the protection voltage generation circuit 100 is changed. Specifically, instead of the voltage divider circuit using a resistive element, a voltage divider circuit using a plurality of PMOS transistors are presented.

Hereinafter, the present invention will be described in detail with reference to the drawings.

Figure 9:
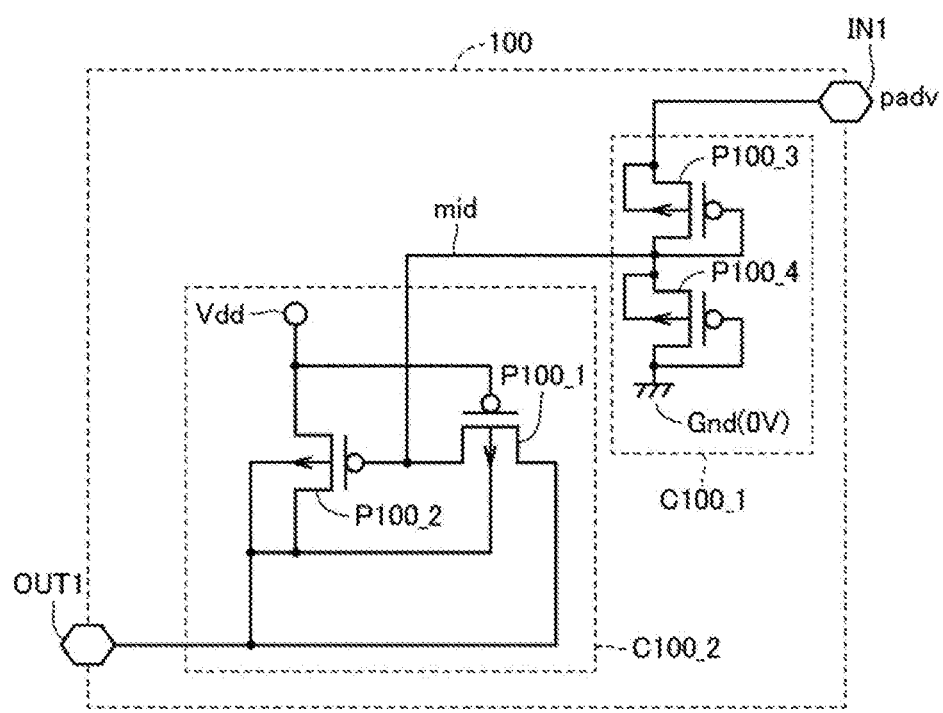
FIG. 9 is a circuit diagram showing a configuration example of a protection voltage generating circuit in the tolerant buffer of the second embodiment.

(Configuration of the protection voltage generating circuit) FIG. 9 is a circuit diagram showing a configuration example of a protection voltage generating circuit in the tolerant buffer of the second embodiment. The configuration of the tolerant buffer of the second embodiment other than the protection voltage generation circuit 100 shown in FIG. 9 is the same as that of the first embodiment described with reference to FIG. 4, and therefore description thereof will not be repeated. The configuration of the circuit C100_2 of the protection voltage generation circuit 100 is the same as that of the first embodiment described with reference to FIG. 4, and therefore description thereof will not be repeated.

The circuit C100_1 of FIG. 9 includes PMOS transistors P100_3 and P100_4 connected in series between the input node IN1 and the ground node. Each of PMOS transistors P100_3 and P100_4 is diode-connected.

Specifically, the sources and the back gates of PMOS transistors P100_3 are connected to the input nodes IN1. The gates and drains of PMOS transistor P100_3 are connected to the mid-node. The sources and back gates of PMOS transistors P100_4 are connected to the mid-node. The gates and drains of PMOS transistor P100_4 are connected to the ground node. As described with reference to FIG. 4, the mid-node is connected to the sources of PMOS transistor P100_1 and the gates of PMOS transistor P100_2.

Although FIG. 9 shows two PMOS transistors connected in series, the number of PMOS transistors connected in series can be changed according to the magnitude of the intermediate voltage mid to be extracted and the power consumption by PMOS transistor P100_1. Furthermore, it is also possible to use a NMOS transistor in place of PMOS transistor, it may be used other types of semi-conductor elements.

It is preferable that the device characteristics of PMOS transistors P100_3 and P100_4 are basically the same, for example, the L/W ratio. The circuit C100_1 of FIG. 9 operates as a state dividing circuit when the pad voltage padv enough to render each of PMOS transistors P100_3 and P100_4 conduction is input to the input node IN1. In this instance, the pad voltage padv is equally divided by PMOS transistors P100_3 and P100_4. Therefore, the circuit C100_1 operates as a voltage dividing circuit having a voltage dividing ratio of 0.5.

(Effect) By using a MOS transistor instead of the resistive element, an effect that the circuit size can be reduced.

More specifically, in the circuit C100_1 of FIG. 4, depending on the absolute value of the resistance elements R100_1 and R100_2, the through current between the input node IN1 and the ground node increases. In order to suppress the penetration current to a maximum of about several μA, the resistance value of the resistive element needs to be about several hundred kΩ to several MΩ. In the case of forming a resistor element having this resistance value inside the LSI, depending on the constraints of the process (e.g., depending on the sheet resistance value of the resistor) circuit area is increased.

In contrast, when using the MOS transistor, since it is sufficient to reduce the gate width W in order to narrow the through current, the circuit area is not enlarged. As a result, the circuit size can be reduced.

Third Embodiment In the third embodiment, an example in which the protection voltage generating circuit of the second embodiment is further modified will be described.

Specifically, the number of PMOS transistors included in the voltage dividing circuit C100_1 increases, and switch elements for switching between operation and non-operation of the circuit C100_1 are provided. Hereinafter will be described in detail with reference to the drawings.

Figure 10:
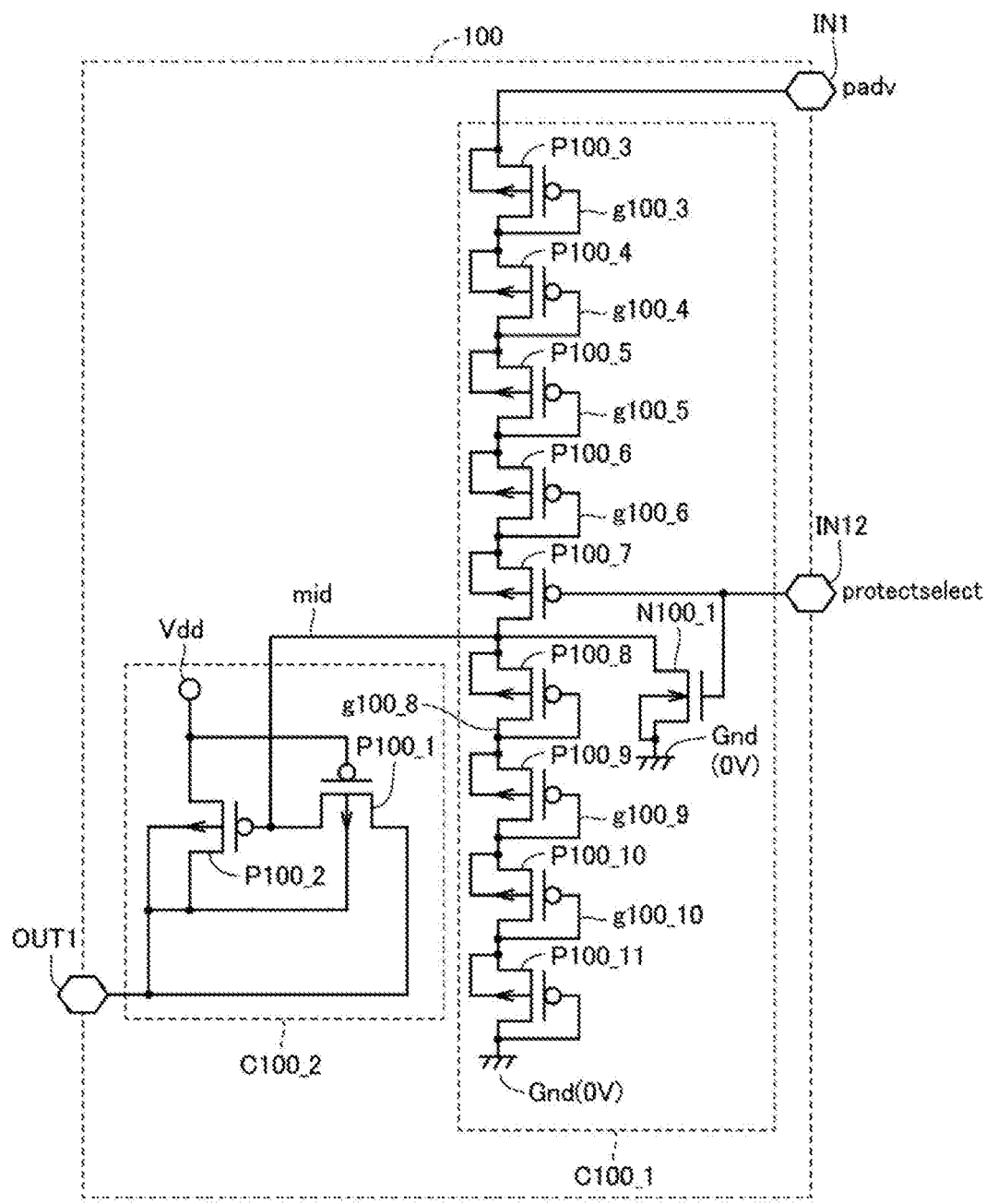
FIG. 10 is a circuit diagram showing a configuration example of a protection voltage generating circuit in the tolerant buffer of the third embodiment.

(Configuration of the protection voltage generating circuit) FIG. 10 is a circuit diagram showing a configuration example of a protection voltage generating circuit in the tolerant buffer of the third embodiment. The configuration of the tolerant buffer of the third embodiment other than the protection voltage generation circuit 100 shown in FIG. 10 is the same as that of the first embodiment described with reference to FIG. 4, and therefore description thereof will not be repeated.

Referring to FIG. 10, protection voltage generating circuit 100 includes an input node IN1, IN12, an output node OUT1, a circuit C100_1, and a circuit C100_2. Here, the connections of the input node IN1 and the output node OUT1 and the configuration of the circuit C100_2 are the same as those of the first embodiment described with reference to FIG. 4, and therefore, descriptions thereof will not be repeated.

The circuit C100_1 includes PMOS transistors P100_3 to P100_11 and a NMOS transistor N100_1. Hereinafter, these connection relationships will be described.

First, PMOS transistors P100_3 to P100_11 are connected in series between the input node IN1 and the ground node in this order. That is, of the two adjacent PMOS transistors, the drain of PMOS transistor on the high voltage side and the source of PMOS transistor on the low voltage side are connected to each other. In each of PMOS transistors P100_3 to P100_6 and P100_8 to P100_11, the gate is connected to the drain and the back gate is connected to the source. That is, each of PMOS transistors P100_3 to P100_6 and P100_8 to P100_11 is diode-connected. The gate voltages (=drain voltage) of PMOS transistors P100_3 to P100_6 and P100_8 to P100_10 are g100_3 to g100_6 and g100_8 to g100_10, respectively.

In PMOS transistor P100_7, the gate is connected to the input node IN12, the drain is connected to the mid node, and the back gate is connected to the source. The selection signals protectselect are input from the inner logic area 2 to the input nodes IN12. PMOS transistor P100_7 functions as a switch device for switching on and off.

In NMOS transistor N100_1, the drain is connected to the mid node, the gate is connected to the input node IN12, and the source and the back gate are connected to the Gnd node. NMOS transistor N100_1 functions as a switch device for switching on and off.

(Operation of the protection voltage generating circuit) The operation of the circuit C100_1 will be described below. First, when the power supply voltage Vdd supplied to the LSI is 0 [V], i.e. will be described when the power supply is shut off. In this instance, the selection signals protectselect inputted from the inner logic area 2 are at a low level. Therefore, NMOS transistor N100_1 is turned off, and PMOS transistor P100_7 is turned on. In this condition, circuit C100_1 generates an intermediate voltage mid by partial pressure of the pad voltage padv given to pad 4, as in the first and second embodiments. The circuit C100_2 outputs the intermediate voltage mid as the protection voltage protectv from the output node OUT1.

Next, the power supply voltage Vdd rises gradually from 0, the case where the operation of the LSI is enabled will be described. When the LSI operation is enabled, the internal logic area 2 changes the step-signal protectselect from low level to high level. As a result, NNOS transistor N100_1 is turned on, and PMOS transistor P100_7 is turned off.

As a result, the through current flowing between the input node IN1 and the ground node can be reduced. Further, since the intermediate voltage mid becomes almost 0 [V], the source of the protection voltage protectv can be explicitly switched to the power supply voltage Vdd.

(Specific example of circuit operation) Hereinafter, the operation of the circuit C100_1 of FIG. 10 will be further described with reference to a specific numerical example. 11, when the power supply voltage Vdd is 0 [V], is a diagram showing the voltage difference between the electrodes of the transistors corresponding to the pad voltage padv in tabular form. The symbols used in the tables are the same as in FIGS. 4, 7, 10, etc.

In FIG. 11, the pad voltage padv is set to 5.5 [V], and the power supply voltage Vdd is set to 0 [V]. When the voltage division ratio of the circuit C100_1 is 0.5, the intermediate voltage mid=protection voltage protectv is 2.75 [V]. The threshold voltage Vtn of NMOS transistor is set to 0.5 [V], and the threshold voltage Vtp of PMOS transistor is set to 0.5 [V]. The allowable voltage difference between the electrodes of the transistors shall be 4.0 [V]. Since the power supply voltage Vdd is 0 [V], the output from the internal logic circuit is 0 [V]. The selection signaling protectselect is 0 [V] because the LSIs are in a non-operating condition at the power supply voltage Vdd=0 [V]. PMOS transistor P100_7 is regarded as a switch, and the voltage difference Vds between the drain and the source of the switch is 0 [V].

As shown in FIG. 11, the padding voltage padv of 5.5V is tensioned with eight PMOS transistors P100_3 to P100_6, P100_8 to P100_11. Thus, the drain-to-source voltage Vds of each of these transistors is 0.69 [V]. The intermediate voltage mid is obtained by dividing the pad-voltage padv of 5.5 [V] and is equal to 2.75 [V].

As is apparent from FIG. 11, the voltage difference between the electrodes of each transistor is within the range of the allowable voltage difference.

Figure 12:
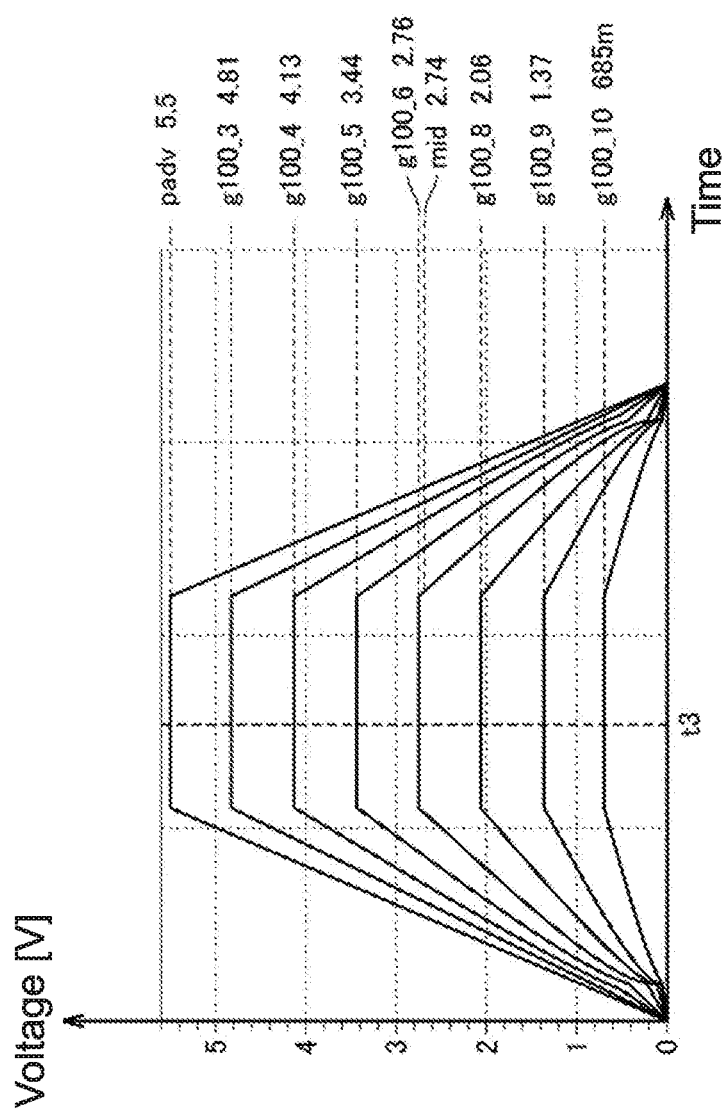
FIG. 12 is a diagram showing a simulation result of the voltage of each node of circuit C100_1 in the case of the conditions shown in FIG. 11.

FIG. 12 is a diagram showing a simulation result of the voltage of each node the circuit C100_1 under the condition shown in FIG. 11. It is understood that the voltages of the respective nodes of the circuit C100_1 are determined as the divided voltages of the pad voltages padv.

For example, the voltage g100_3 of the gates and drains of PMOS transistor P100_3 is g100_3=padv*7/8=5.5*7/8=4.81 [V] . . . (2) Is determined by. The gate voltages of other PMOS transistors are similarly obtained.

FIG. 13 is a diagram showing, in a tabular form, the voltage difference between the electrodes of the transistors according to the protection voltage protectv when the power supply voltage Vdd is 3.3 [V]. The symbols used in the tables are the same as in FIGS. 4, 7, 10, etc.

In FIG. 13, the pad voltage padv is 5.5 [V], and the power supply voltage Vdd=protection voltage protectv is 3.3 [V].

Assuming that the voltage division ratio of the circuit C100_1 is 0.5, the intermediate voltage mid is 2.75 [V]. The threshold voltage Vtn of NMOS transistor is set to 0.5 [V], and the threshold voltage Vtp of PMOS transistor is set to 0.5 [V]. The allowable voltage difference between the electrodes of the transistors shall be 4.0 [V]. Since the power supply voltage Vdd is 3.3 [V], the logic circuitry inside is operating. Therefore, the selection signal protectselect becomes a high level signal.

As shown in FIG. 13, NMOS transistor N100_1 is in the on state, and PMOS transistors P100_7 to P100_11 are in the off state. The intermediate voltage mid is 0 [V].

On the other hand, PMOS transistors P100_3 to P100_6 connected in series between the input node IN1 and the input node IN12 are turned on. In these transistors, per one, the voltage drops by 0.5 [V] corresponding to the threshold voltage of PMOS transistor. As shown in FIG. 13, the voltage difference between the electrodes of PMOS transistor P100_7 is within the allowable operating voltage difference.

Figure 14:
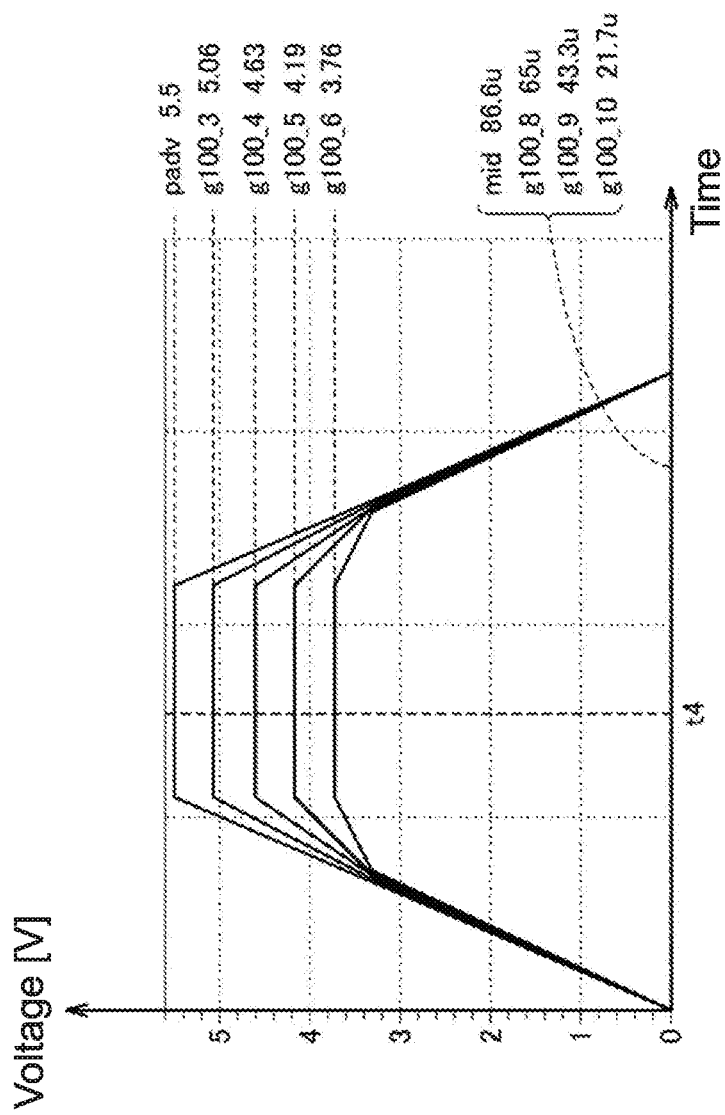
FIG. 14 is a diagram showing the simulation results of the voltage of each node of circuit C100_1 in the case of the conditions shown in FIG. 13.

FIG. 14 is a diagram showing a simulation result of the voltage of each node of the circuit C100_1 under the condition shown in FIG. 13.

As shown in FIG. 14, the gate voltage (=drain voltage) g100_3 to g100_6 of PMOS transistors P100_3 to P100_6 changes in accordance with the pad voltage padv. These voltages are obtained by dividing the voltage difference between the pad voltage padv (=5.5 [V]) and the voltage of the selection signal protectselect (=3.3 [V]). The gate voltage (=drain voltage) g100_8 to g100_10 of PMOS transistors P100_8 to P100_10 are close to the gate voltage 0 [V].

Figure 15:
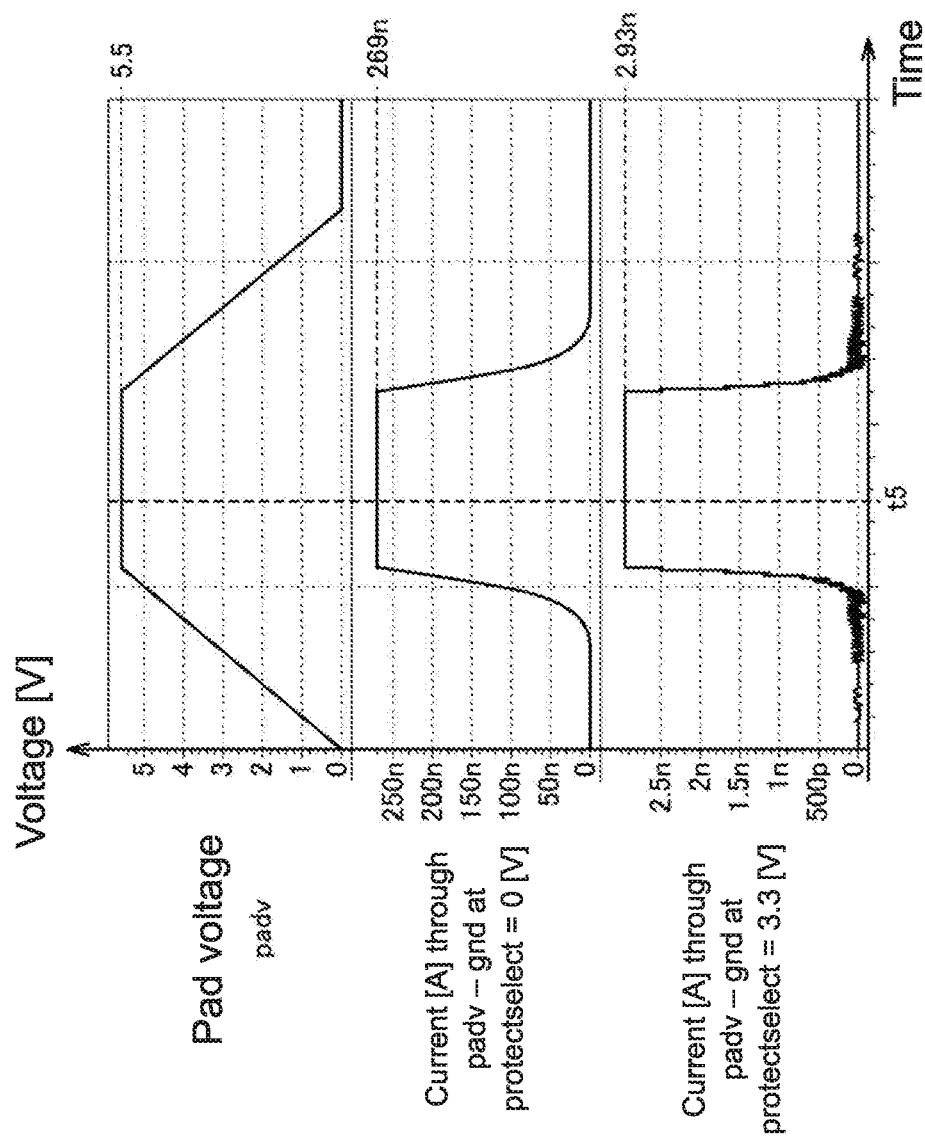
FIG. 15 is a diagram showing the magnitude of the through current corresponding to the protection voltage protectv.

FIG. 15 shows the magnitude of the through current according to the protection voltage protectv. In FIG. 15, the pad voltage padv, the penetration current when the protection voltage protectv is mid, and the penetration current when the protection voltage protectv is Vdd are shown in order from the top. The padding voltage padv is at most 5.5 [V] (at time t5). When the power supply voltage Vdd=0 [V] and the selection signal protectselect=0 [V], the circuit C100_1 in FIG. 10 functions as a voltage dividing circuit that divides the pad voltage padv. In this instance, the magnitude of the through current flowing between the input node IN1 and the end node is at most 269 [nA].

On the other hand, when the power supply voltage Vdd=protectselect=3.3 [V], the power supply voltage Vdd is selected as the protection voltage protectv. In this case, the magnitude of the through current is 2.93 [nA] at the most, which is reduced by a factor of about 100 compared to the case where Vdd=0 [V].

(Effect) As described above, according to the third embodiment, the operation/non-operation of the voltage divider C100_1 is switched in accordance with the selection signals protectselect outputted from the inner logic area 2. Thus, it is possible to explicitly select the power supply voltage Vdd as a power supply for realizing the tolerant function.

Further, when the power supply voltage Vdd is selected, the switching PMOS transistor P100_7 provided in the voltage divider C100_1 is controlled to be turned off. Therefore, the through current flowing through the voltage dividing circuit C100_1 can be suppressed.

(Fourth Embodiment) In the first embodiment shown in FIG. 4, the current driving capability of PMOS transistor P10_1 constituting the output buffer 10 is not determined only by the drain-source voltage Vds of PMOS transistor P10_1. Since the drain current of PMOS transistor P10_1 is supplied through PMOS transistor P100_2, the drain current is also affected by the gate-source voltage Vgs of PMOS transistor P100_2.

Accordingly, as the pad voltage padv changes, the current drive capability of PMOS transistor P10_1 will also change accordingly.

In order to solve the above problems, the tolerant buffer of the fourth embodiment further includes a protection circuit 400, and a PMOS transistor P10_2 is added to the output buffer 10. Hereinafter will be described in detail with reference to the drawings. Since the configuration of the other tolerant buffers is the same as that in the case of FIG. 4, the same reference numerals are given to the same or corresponding portions, and description thereof will not be repeated.

The protection circuit 400 controls the operation of the output buffer 10. Therefore, the protection circuit 400 may be considered as a part of the configuration of the protection circuit 200.

Figure 16:
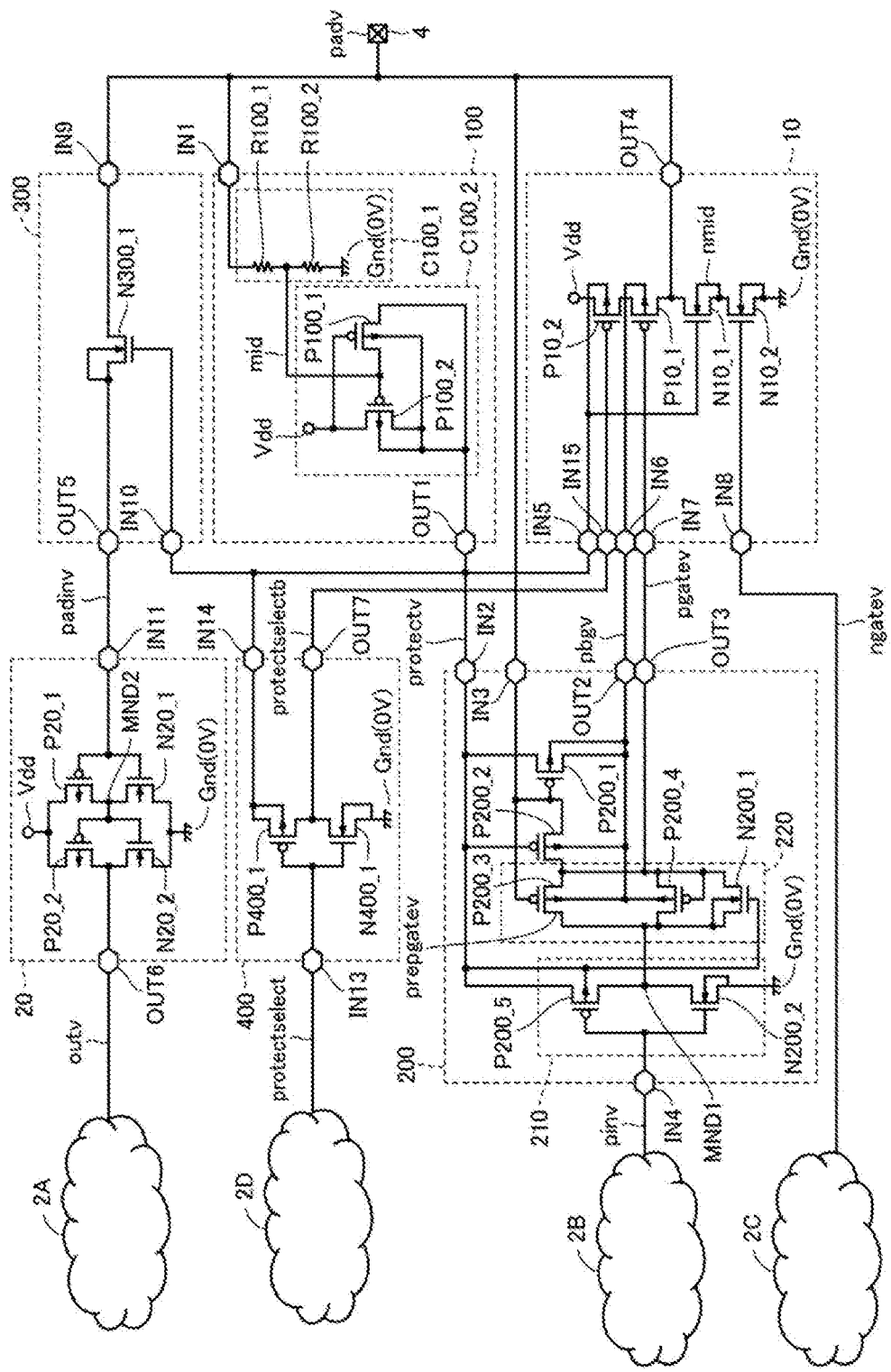
FIG. 16 is a circuit diagram showing a configuration of a tolerant buffer according to a fourth embodiment.

(Configuration of tolerant buffer) FIG. 16 is a circuit diagram showing a configuration of a tolerant buffer according to the fourth embodiment. The tolerant buffer of FIG. 16 differs from the tolerant buffer of FIG. 4 in that it further includes a protection circuit 400.

The protection circuit 400 includes, for example, an input node IN13, IN14, an output node OUT7, a PMOS transistor P400_1, and a NMOS transistor N400_1. Hereinafter, these connection relationships will be described.

The input node IN13, the selection signal protectselect is input from the internal logic circuit 2D portion of the internal logic region 2 in FIG. 1). The input signal node IN14, the protection voltage protects is input from the protection voltage generating circuit 100. In PMOS transistor P400_1, the gate is connected to the input node IN13, and the source and the back gate are connected to the input node IN14. The drain of PMOS transistor P400_1 is connected to the output node OUT7. In NMOS transistor N400_1, the gate is connected to the input node IN13, and the source and the back gate are connected to the Gnd node. The drain of NMOS transistor N400_1 is connected to the output node OUT7.

PMOS transistor P400_1 and NMOS transistor N400_1 configured as described above operate as inverters. Therefore, the selection signal protectselectb output from the output node OUT7 is a signal obtained by inverting the logical level of the selection signal protectselect input to the input node IN13.

The output buffer 10 differs from the output buffer 10 of FIG. 4 in that it further includes an input-node IN15 and a PMOS transistor P10_2. First, these connections will be described.

The input node IN15, by being connected to the output node OUT7 of the protection circuit 400, the selection signal protectselectb is input.

For PMOS transistor P10_2, the source is connected to the Vdd node, the gate is connected to the input node IN15, and the back gate is connected to the input node IN5. The drain of PMOS transistor P10_2 is connected to the source of PMOS transistor P10_1. Unlike FIG. 4, the source of PMOS transistor P10_1 is not connected to the input node IN5.

(Output Buffer Operation) Next, the operation of the output buffer 10 of FIG. 16 will be described. First, if the power supply voltage Vdd is 0 [ ], i.e., the case where the power supply for LSI is cut off will be described. In this case, the selection signal protectselect outputted from the internal logic circuit 20 becomes low level. Accordingly, the protection circuit 400 outputs a high-level selection signal protectselectb (equal to the protection voltage protect) from the output node OUT7. As a result, the protection voltage protectv (<Vdd) is inputted to the gate of PMOS transistor P10_2, so that PMOS transistor P10_2 is turned off. As a result, through paths are not formed between the drains and sources of PMOS transistor P10_2.

Next, a normal operation in which the power supply voltage Vdd is, for example, 3.3 [V] will be described. In this case, the internal logic circuit 20 sets the select signal protectselect to a high level. Thus, the selection signal protectselectb output from the protection circuit 400 via the output node OUT7 becomes low level (0 [V]). Therefore, since PMOS transistor P10_2 is turned on, the source voltage of PMOS transistor P10_1 becomes equal to the power supply voltage Vdd. Therefore, it is possible to prevent the pad voltage padv affects the current driving capability of PMOS transistor P10_1.

Figure 17:
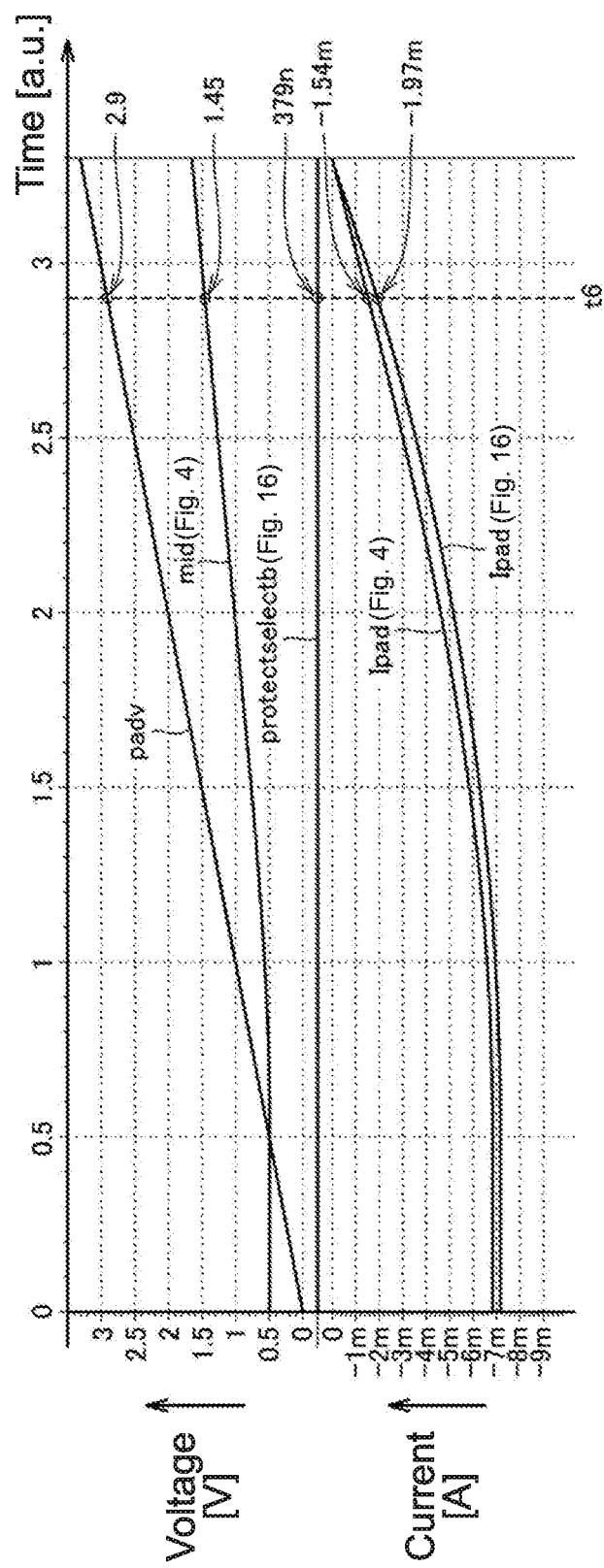
FIG. 17 is a diagram showing a current driving capability of the output buffer during normal operation.

FIG. 17 is a diagram showing the current driving capability of the output buffer during normal operation. In FIG. 17, the pad voltage padv, the intermediate voltage mid (in the case of FIG. 4), and the voltages [V] of the selection signals protectselectb (in the case of FIG. 16) are shown in this order from the top. Furthermore, in FIG. 17, a simulated waveform of the drive current Ipad of the output buffer is shown comparing the case of FIG. 4 and the case of FIG. 16. The horizontal axis of the graph shown in FIG. 17 is a time axis, and the unit of the time axis is an arbitrary unit (a.u.: arbitrary unit).

Referring to FIG. 17, comparing the current drive amount at time t6. In the case of FIG. 4, the current supplied from the output buffer 10 to the pad 4 is 1.54 mA. In contrast, the current supplied from the output buffer 10 to the pad 4 in the case of FIG. 16 is 1.97 mA. Thus, it can be seen that the current driving capability of PMOS transistor P10_1 is improved in the present embodiment.

(Effect) As described above, in the first embodiment, the path of the supply path of the protection voltage protectv and the output current of PMOS transistor P10_1 was the same.

Therefore, there is a problem that the current supplying capability of PMOS transistor P10_1 is affected by the pad voltage padv.

In contrast, according to the output buffer 10 of the present embodiment, PMOS transistor P10_2 for overvoltage protection in series with PMOS transistor P10_1 for current drive is connected. The output current of PMOS transistor P10_1 is supplied from the Vdd node via PMOS transistor P10_2. That is, the path of the output current of the output buffers 10 is separated from the supply path of the protection voltage protectv. As a result, the current driving capability of the output buffer 10 can be further improved.

According to the above configuration, the electrostatic discharge (ESD: Electro-Static Discharge) path and the protection voltage protectv supplying path are separated from each other. Therefore, the risk of destruction due to ESD can also be reduced.

Also, the fourth embodiment can be combined with each of the second and third embodiments. That is, the circuit C100_1 of FIG. 16 can be replaced with the circuit C100_1 of FIG. 9, or can be replaced with the circuit C100_1 of FIG. 10.

Although the invention made by the present inventor has been specifically described based on the embodiment, the present invention is not limited to the above embodiment, and it is needless to say that various modifications can be made without departing from the gist thereof.

What is claimed is:

1. A semiconductor device comprising:
   a pad;
   an internal logic circuit operable at a power supply voltage;
   an output buffer coupled to the pad, and configured to drive an external circuit coupled to the pad based on an output signal from the internal logic circuit;

a protection voltage generating circuit coupled to the pad, and configured to output a protection voltage that is a larger one of a divided voltage and the power supply voltage, the divided voltage being obtained by dividing a voltage applied to the pad; and a first protection circuit coupled between the internal logic circuit and the output buffer, operable at the protection voltage and configured to protect the internal logic circuit and the output buffer when a voltage greater than the protection voltage is applied to the pad.

2. The semiconductor device according to claim 1, wherein the protection voltage generating comprising:
   a first generating circuit configured to output the divided voltage; and
   a second generating circuit configured to output the larger one of the divided voltage and the power supply voltage as the protection voltage to an output node, and
wherein the second generating circuit comprising:
   a first P-type transistor having a first electrode coupled to the first generating circuit to receive the divided voltage, a second electrode coupled to the output node and a control electrode receiving the power supply voltage; and
   a second P-type transistor having a first electrode receiving the power supply voltage, a second electrode coupled to the output node and a control electrode coupled to the first generating circuit to receive the divided voltage.

3. The semiconductor device according to claim 2, wherein the first generating circuit includes a plurality of resistors serially coupled between the pad and a ground node to which a ground voltage is applied.

4. The semiconductor device according to claim 2, wherein the first generating circuit includes a plurality of transistors serially diode-connected between the pad and a ground node to which a ground voltage is applied.

5. The semiconductor device according to claim 4, wherein the first generating circuit further includes:
   a first switch disposed between the plurality of the transistors, and controlled by a control signal from the internal logic circuit;
   a second switch disposed between a divided voltage node outputting the divided voltage and the ground node, and controlled by the control signal, and
wherein a state of the second switch is complementary with a state of the first switch.

6. The semiconductor device according to claim 1, wherein the output buffer includes a third P-type transistor having a first electrode receiving the protection voltage and a second electrode coupled to the pad,
wherein the first protection circuit is configured to supply the output signal from the internal logic circuit to a control electrode of the third P-type transistor, and
wherein, when the voltage larger than the protection voltage is supplied to the pad, the first protection circuit supplies the voltage of the pad with the control electrode of the third P-type transistor.

7. The semiconductor device according to claim 6, wherein the first protection circuit includes a fourth P-type transistor having a first electrode coupled to the pad, a second electrode coupled to the control electrode of the third P-type transistor and a control electrode receiving the protection voltage.

8. The semiconductor device according to claim 1, wherein the output buffer includes:
   a third P-type transistor having a first electrode receiving the power supply voltage;
   a fourth P-type transistor having a first electrode coupled to a second electrode of the third P-type transistor and a second electrode coupled to the pad,
wherein the first protection circuit outputs the output signal from the internal logic circuit to a control electrode of the fourth P-type transistor,
wherein the first protection circuit includes an inverter operable at the protection voltage, and
wherein the inverter outputs an inverted signal which has an inverted logic level of a control signal from the internal logic circuit to the control electrode of the third P-type transistor.

9. The semiconductor device according to claim 1, further comprising:
   an input buffer configured to drive the internal logic circuit based on an input signal from the pad; and
   a second protection circuit operable at the protection voltage, and configured to protect the input buffer when a voltage larger than the protection voltage is supplied to the pad.

10. The semiconductor device according to claim 9, wherein the second protection circuit includes a first N-type transistor having a first electrode coupled to the pad, a second electrode coupled to an input node of the input buffer and a control electrode receiving the protection voltage.

11. A semiconductor device comprising:
a pad;
an internal logic circuit operable at a power supply voltage;
an input buffer configured to drive the internal logic circuit based on an input signal from the pad;
a protection voltage generating circuit coupled to the pad, and configured to output a protection voltage that is a larger one of a divided voltage and the power supply voltage, the divided voltage being obtained by dividing a voltage applied to the pad; and
a protection circuit coupled between the pad and the input buffer, operable at the protection voltage and configured to protect the internal logic circuit when a voltage greater than the protection voltage is applied to the pad.

* * * * *